(12) United States Patent
Vora et al.

(10) Patent No.: US 10,976,483 B2
(45) Date of Patent: Apr. 13, 2021

(54) VARIABLE-ETCH-DEPTH GRATINGS

(71) Applicant: Facebook Technologies, LLC, Menlo Park, CA (US)

(72) Inventors: Ankit Vora, Bothell, WA (US); Nihar Ranjan Mohanty, Snoqualmie, WA (US); Austin Lane, Bellevue, WA (US); Matthew E. Colburn, Woodinville, WA (US); Elliott Franke, Bellevue, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/799,532

(22) Filed: Feb. 24, 2020

(65) Prior Publication Data

US 2020/0271850 A1 Aug. 27, 2020

Related U.S. Application Data

(60) Provisional application No. 62/810,854, filed on Feb. 26, 2019.

(51) Int. Cl.
*G02B 27/01* (2006.01)
*G03F 7/26* (2006.01)
(Continued)

(52) U.S. Cl.
CPC ......... *G02B 6/0065* (2013.01); *G02B 6/0016* (2013.01); *G02B 6/0038* (2013.01);
(Continued)

(58) Field of Classification Search
None
See application file for complete search history.

(56) References Cited

U.S. PATENT DOCUMENTS 3,914,608 A 10/1975 Malmberg
3,980,883 A * 9/1976 Franks ............... G21K 1/06
378/84

(Continued)

FOREIGN PATENT DOCUMENTS

CA 2214927 4/1999
CA 2214927 A1 * 4/1999 ......... G02B 6/02138
(Continued)

OTHER PUBLICATIONS

Chandross, et al., "New Photoresists for Deep Ultraviolet (<300 nm) Exposure", Canadian Journal of Chemistry, vol. 61, 1983, pp. 817-823.
(Continued)

*Primary Examiner* — Rhonda S Peace
(74) *Attorney, Agent, or Firm* — Weaver Austin Villeneuve & Sampson LLP

(57) ABSTRACT

Disclosed herein are techniques for fabricating straight or slanted variable-etch-depth gratings. A photoresist material for fabricating a variable-etch-depth grating in a substrate is sensitive to light with a wavelength shorter than 300 nm and has an etch rate comparable to the etch rate of the substrate. A depth of an exposed portion of a photoresist material layer including the photoresist material correlates with the exposure dose. After exposure using a gray-scale mask and development, the photoresist material layer has a non-uniform thickness. The photoresist material layer with the non-uniform thickness and the underlying substrate are etched using a straight etching or slanted etching process to form the straight or slanted variable-etch-depth grating in the substrate. The variable-etch-depth grating is characterized by a non-uniform depth profile corresponding to the non-uniform thickness of the photoresist material layer before etching.

25 Claims, 17 Drawing Sheets

(51) Int. Cl.
  *G03F 7/00* (2006.01)
  *G03F 7/20* (2006.01)
  *F21V 8/00* (2006.01)
  *G03F 7/16* (2006.01)
  *G03F 7/09* (2006.01)
  *G03F 7/039* (2006.01)

(52) U.S. Cl.
  CPC ....... *G02B 27/0172* (2013.01); *G03F 7/0007* (2013.01); *G03F 7/039* (2013.01); *G03F 7/091* (2013.01); *G03F 7/16* (2013.01); *G03F 7/2002* (2013.01); *G03F 7/26* (2013.01); *G02B 2027/0178* (2013.01)

(56) References Cited

U.S. PATENT DOCUMENTS

| | | | |
|---|---|---|---|
| 4,163,155 A | 7/1979 | Alles et al. | |
| 5,876,902 A | 3/1999 | Veneklasen et al. | |
| 5,888,698 A * | 3/1999 | Koh | C08F 8/30 430/281.1 |
| 6,545,808 B1 * | 4/2003 | Ehbets | G02B 5/1857 359/15 |
| 6,583,933 B2 * | 6/2003 | Lamartine | G02B 5/1842 359/567 |
| 6,602,647 B2 * | 8/2003 | Iwasa | C07D 333/32 430/270.1 |
| 6,720,565 B2 | 4/2004 | Innes et al. | |
| 6,753,129 B2 * | 6/2004 | Livesay | G03F 7/2024 430/296 |
| 6,812,471 B2 | 11/2004 | Popiolkowski et al. | |
| 7,176,471 B2 | 2/2007 | Ito et al. | |
| 7,218,449 B2 * | 5/2007 | Drenten | G11B 7/127 359/569 |
| 7,481,565 B2 * | 1/2009 | Yu | G02B 6/0038 362/615 |
| 7,663,124 B2 | 2/2010 | Kasono et al. | |
| 8,168,373 B2 | 5/2012 | Shew | |
| 8,614,052 B2 | 12/2013 | Galler | |
| 8,749,890 B1 | 6/2014 | Wood et al. | |
| 8,975,601 B1 | 3/2015 | Chen | |
| 9,372,347 B1 | 6/2016 | Levola et al. | |
| 9,378,926 B2 | 6/2016 | Kuo et al. | |
| 9,423,360 B1 * | 8/2016 | Kostamo | G01N 21/958 |
| 9,535,253 B2 * | 1/2017 | Levola | G02B 27/0172 |
| 9,690,208 B2 | 6/2017 | Yu | |
| 9,715,067 B1 | 7/2017 | Brown et al. | |
| 9,827,209 B2 | 11/2017 | Kostamo | |
| 9,885,870 B2 * | 2/2018 | Stenberg | G02B 5/1823 |
| 1,001,884 A1 | 7/2018 | Levola et al. | |
| 1,006,734 A1 | 9/2018 | Vallius et al. | |
| 1,015,672 A1 | 12/2018 | TeKolste et al. | |
| 1,021,606 A1 | 2/2019 | Popovich et al. | |
| 1,024,133 A1 | 3/2019 | Popovich et al. | |
| 1,025,454 A1 | 4/2019 | Kollin et al. | |
| 10,274,823 B2 * | 4/2019 | Singh | G03F 7/0002 |
| 1,031,767 A1 | 6/2019 | Levola | |
| 10,422,934 B2 * | 9/2019 | Valera | G02B 5/1828 |
| 1,043,706 A1 | 10/2019 | Popovich et al. | |
| 1,045,914 A1 | 10/2019 | Popovich et al. | |
| 10,436,958 B2 * | 10/2019 | Melli | G02B 27/0172 |
| 1,053,411 A1 | 1/2020 | Calafiore et al. | |
| 10,527,865 B2 * | 1/2020 | Yang | G02B 27/4255 |
| 1,067,087 A1 | 6/2020 | Popovich et al. | |
| 1,082,389 A1 | 11/2020 | Peroz et al. | |
| 2001/0028039 A1 | 10/2001 | Plontke et al. | |
| 2002/0122015 A1 | 9/2002 | Song et al. | |
| 2002/0146627 A1 | 10/2002 | Suleski et al. | |
| 2003/0007444 A1 | 1/2003 | Tsukuda et al. | |
| 2003/0077039 A1 | 4/2003 | Kurihara et al. | |
| 2005/0035308 A1 | 2/2005 | Javer et al. | |
| 2005/0151284 A1 | 7/2005 | Soeno | |
| 2006/0108542 A1 | 5/2006 | Ito | |
| 2006/0110116 A1 | 5/2006 | Sakai et al. | |
| 2006/0115745 A1 | 6/2006 | Yasuda | |
| 2006/0121396 A1 | 6/2006 | Gauglitz et al. | |
| 2006/0124869 A1 | 6/2006 | Yoneyama et al. | |
| 2007/0160336 A1 | 7/2007 | Sakai et al. | |
| 2008/0026258 A1 | 1/2008 | Okino | |
| 2008/0094694 A1 | 4/2008 | Yun et al. | |
| 2008/0112670 A1 * | 5/2008 | Brooks | G02B 6/12007 385/37 |
| 2008/0138013 A1 | 6/2008 | Parriaux | |
| 2008/0197295 A1 | 8/2008 | Kaule et al. | |
| 2008/0237460 A1 | 10/2008 | Fragner et al. | |
| 2009/0123870 A1 | 5/2009 | Usa et al. | |
| 2009/0128911 A1 * | 5/2009 | Itzkovitch | G02B 5/32 359/575 |
| 2009/0134340 A1 | 5/2009 | Furuhashi et al. | |
| 2009/0166553 A1 | 7/2009 | Okino | |
| 2009/0230328 A1 | 9/2009 | Komatsu et al. | |
| 2010/0237262 A1 | 9/2010 | Usa et al. | |
| 2011/0038049 A1 * | 2/2011 | Vallius | G02B 5/1809 359/575 |
| 2011/0255388 A1 | 10/2011 | Goshima et al. | |
| 2013/0027683 A1 | 1/2013 | Yamashita | |
| 2013/0051730 A1 | 2/2013 | Travers et al. | |
| 2013/0058370 A1 | 3/2013 | Chang-Hasnain et al. | |
| 2014/0104665 A1 | 4/2014 | Popovich et al. | |
| 2014/0140653 A1 | 5/2014 | Brown et al. | |
| 2014/0140654 A1 | 5/2014 | Brown et al. | |
| 2014/0204455 A1 | 7/2014 | Popovich et al. | |
| 2014/0252228 A1 | 9/2014 | McMorran | |
| 2015/0002528 A1 | 1/2015 | Bohn et al. | |
| 2015/0289762 A1 | 10/2015 | Popovich et al. | |
| 2015/0344353 A1 | 12/2015 | Han et al. | |
| 2016/0035539 A1 * | 2/2016 | Sainiemi | B81C 1/00547 204/298.36 |
| 2016/0116979 A1 | 4/2016 | Border | |
| 2016/0209657 A1 | 7/2016 | Popovich et al. | |
| 2017/0243718 A1 | 8/2017 | Motosugi | |
| 2017/0307886 A1 | 10/2017 | Stenberg et al. | |
| 2017/0307887 A1 | 10/2017 | Stenberg et al. | |
| 2018/0052276 A1 | 2/2018 | Klienman et al. | |
| 2018/0052501 A1 | 2/2018 | Jones, Jr. et al. | |
| 2018/0059297 A1 | 3/2018 | Peroz et al. | |
| 2018/0059304 A1 | 3/2018 | Bhargava et al. | |
| 2018/0095201 A1 * | 4/2018 | Melli | G02B 6/124 |
| 2018/0149791 A1 | 5/2018 | Urness et al. | |
| 2018/0188542 A1 | 7/2018 | Waldern et al. | |
| 2018/0232048 A1 | 8/2018 | Popovich et al. | |
| 2018/0275350 A1 | 9/2018 | Oh et al. | |
| 2018/0284440 A1 | 10/2018 | Popovich et al. | |
| 2019/0004219 A1 | 1/2019 | Tervo | |
| 2019/0041634 A1 | 2/2019 | Popovich et al. | |
| 2019/0324176 A1 * | 10/2019 | Colburn | G02B 5/1857 |
| 2019/0324202 A1 * | 10/2019 | Colburn | G02B 5/1857 |
| 2020/0026074 A1 | 1/2020 | Waldern et al. | |
| 2020/0088932 A1 | 3/2020 | Schultz et al. | |
| 2020/0209630 A1 | 7/2020 | Schultz et al. | |
| 2020/0278554 A1 | 9/2020 | Schultz et al. | |

FOREIGN PATENT DOCUMENTS

| | | |
|---|---|---|
| WO | 2019209422 | 10/2019 |
| WO | 2019209527 | 10/2019 |
| WO | 2020176528 A1 | 9/2020 |

OTHER PUBLICATIONS

International Application No. PCT/US2020/019727, International Search Report and Written Opinion dated May 29, 2020, 13 pages.
Notice of Allowance dated Sep. 17, 2019 in U.S. Appl. No. 15/713,419.
U.S. Final Office Action dated Jul. 5, 2019 in U.S. Appl. No. 15/713,419.
U.S. Non-Final Office Action dated Mar. 6, 2019 in U.S. Appl. No. 15/713,419.
U.S. Restriction Requirement dated Dec. 18, 2018 in U.S. Appl. No. 15/713,419.

(56) References Cited

OTHER PUBLICATIONS

U.S. Restriction Requirement dated Jul. 13, 2020 in U.S. Appl. No. 16/437,636.
U.S. Non-Final Office Action dated Nov. 10, 2020 in U.S. Appl. No. 16/437,636.
"New Grayscale Technique Opens a Third Dimension for Nanoscale Lithography", NIST, Available Online at: https://www.nisl.gov/news-events/news/2013/08/new-grayscale-technique-opens-third-dimension-nanoscale-lithography, Aug. 28, 2013, 3 pages.
"Stitch-Free Lithography", Available Online at: https://www.raith.com/technology/stitch-free-lithography.html, Accessed from Internet at Feb. 10, 2017, 1 page.
Blazed grating, From Wikipedia, the free encyclopedia, last edited on Dec. 26, 2016, 3 pages. Available Online at: https://en.wikipedia.org/wiki/Blazed_grating.
Electron-beam lithography, From Wikipedia, the free encyclopedia, last edited on Sep. 12, 2017, 7 pages. Available Online at: https://en.wikipedia.org/wiki/Electron-beam_lithography.
Grayscale Lithography, Available Online at: http://www.eng.auburn.edu/~sylee/gray.html, 1 page.
Kirchner et al., ZEP520A—A resist for electron-beam grayscale lithography and thermal reflow, Microelectronic Engineering, vol. 153, Mar. 5, 2016, pp. 71-76.
Kristjánsson, Sigurgeir, et al. "Circular grating coupled DBR laser with integrated focusing outcoupler." IEEE Photonics Technology Letters 9.4 (1997): 416-418 (Year: 1997).
Optical Components, retrieved from https://microdevices.jpl.nasa.gov/capabilities/optical-components/process-for-3-d-surface-relief-profiles.php and printed on Feb. 10, 2017.
Steingrüber, et al. "Continuously chirped gratings for DFB-lasers fabricated by direct write electron-beam lithography". Microelectronic engineering, 61, 331-335 (Year: 2002).*.
Yu, et al., "The evaluation of photo/e-beam complementary grayscale lithography for high topography 3D structure", Proc. SPIE 8682, Advances in Resist Materials and Processing Technology XXX, 868212, retrieved from at: http://proceedings.spiedigitallibrary.org/proceeding.aspx?articleid=1674320, Mar. 29, 2013 and printed on Feb. 10, 2017.

* cited by examiner

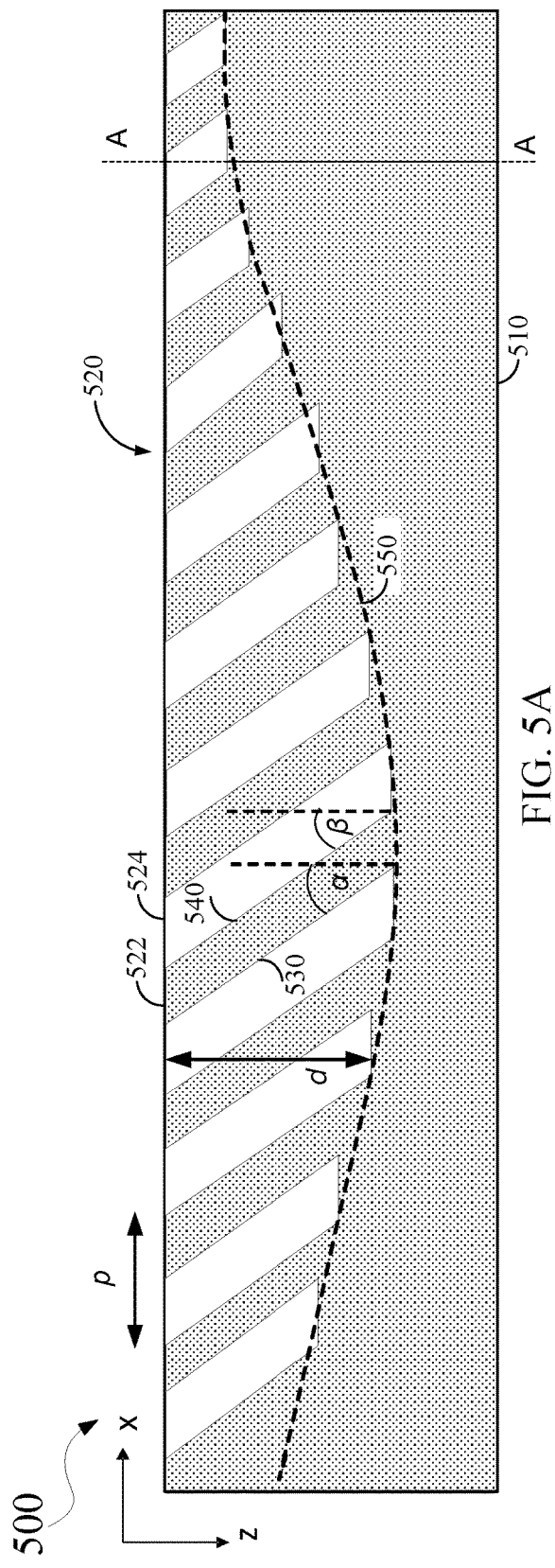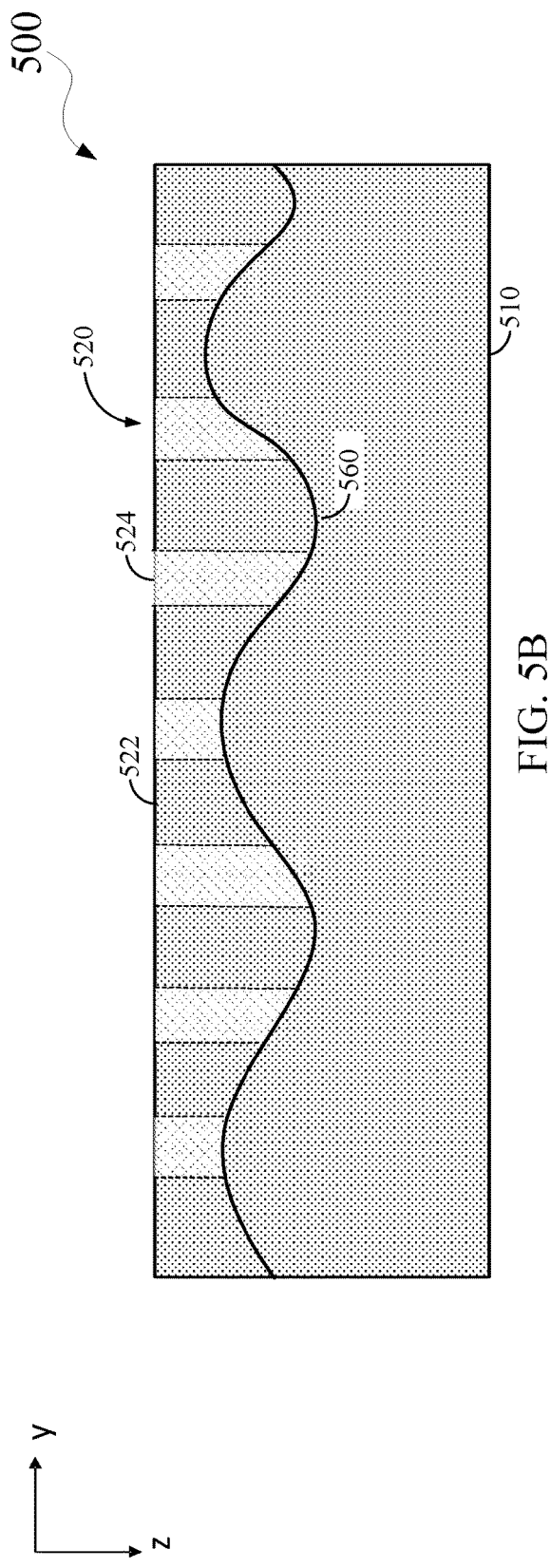
FIG. 5A
FIG. 5B

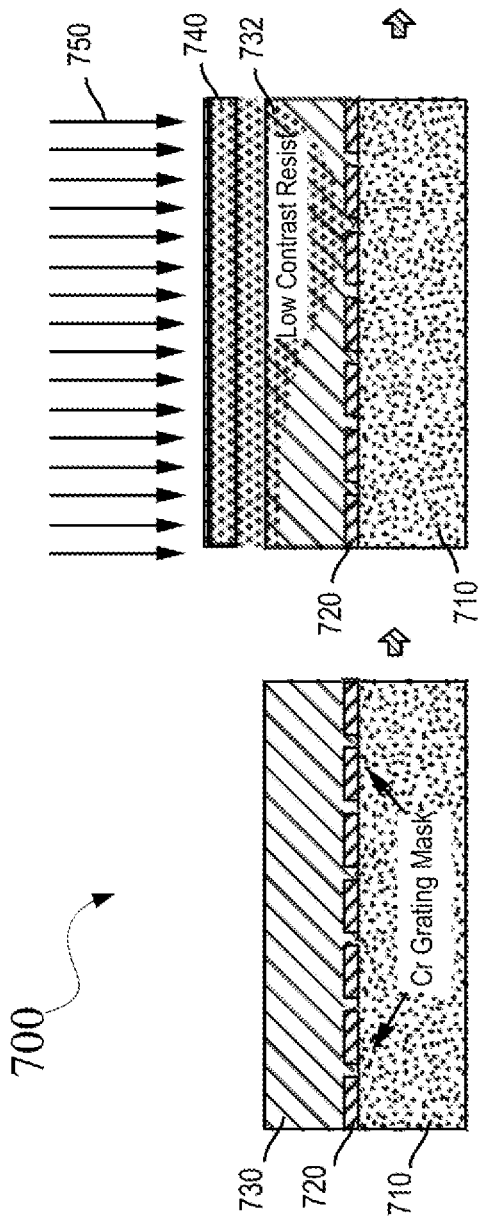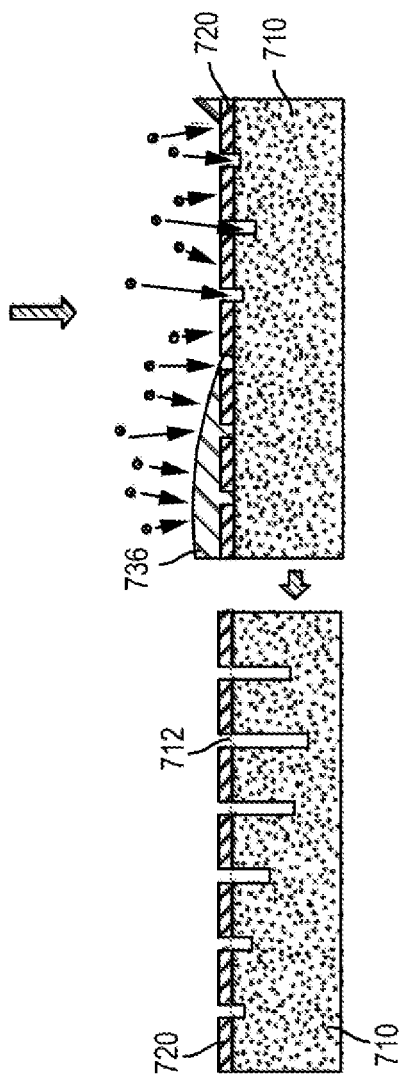

VARIABLE-ETCH-DEPTH GRATINGS

CROSS-REFERENCE IN NON-PROVISIONAL CONVERSION

This patent application claims benefit of and priority to U.S. Provisional Patent Application Ser. No. 62/810,854, filed Feb. 26, 2019, entitled "Variable-Etch-Depth Gratings," which is assigned to the assignee hereof and is hereby incorporated by reference in its entirety for all purposes.

BACKGROUND

An artificial reality system, such as a head-mounted display (HMD) or heads-up display (HUD) system, generally includes a near-eye display (e.g., a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example of an optical see-through AR system may use a waveguide-based optical display, where light of projected images may be coupled into a waveguide (e.g., a transparent substrate), propagate within the waveguide, and be coupled out of the waveguide at different locations. In some implementations, the light of the projected images may be coupled into or out of the waveguide using a diffractive optical element, such as a grating. Various techniques can be used to fabricate gratings or to fabricate a mold for imprinting gratings. However, these techniques are generally incapable of etching a grating structure with a desired three-dimensional profile, such as a grating structure having slanted ridges, different periods or duty cycles, and/or a height or depth profile that is non-uniform over the area of the grating structure.

SUMMARY

This disclosure relates generally to waveguide-based near-eye display systems. More specifically, disclosed herein are techniques for fabricating a straight or slanted grating structure having a variable etch depth, a variable duty cycle, and/or a variable period for a waveguide-based near-eye display system. According to some embodiments, a method for fabricating a variable-etch depth grating includes forming a patterned etch mask on a substrate; depositing a photoresist material layer sensitive to ultraviolet (UV) light on the patterned etch mask, exposing the photoresist material layer to UV light through a variable transparency photomask, developing the UV-light-exposed photoresist material layer to form a patterned photoresist layer having a non-uniform thickness, and etching the patterned photoresist layer and the substrate to obtain a grating having a non-uniform etch depth in the substrate, where the patterned photoresist layer is characterized by an etch rate comparable to (e.g., equal to or greater than) an etch rate of the substrate. The method may also include removing the patterned photoresist layer and the patterned etch mask from the substrate to expose the grating.

In some embodiments, etching the patterned photoresist layer and the substrate includes etching the patterned photoresist layer and the substrate at a slant angle greater than about 10° with respect to a surface normal of the substrate, such as between about 30° and about 70°. In some embodiments, etching the patterned photoresist layer and the substrate may include etching the patterned photoresist layer and the substrate using at least one of an oxygen source including $O_2$, $N_2O$, $CO_2$, or CO; a nitrogen source including $N_2$, $N_2O$, or $NH_3$; or ions with an energy between about 100-500 eV. In some embodiments, the variable transparency photomask may include a gray-scale photomask. In some embodiments, the gray-scale photomask may include at least 8 different transmissivity levels. In some embodiments, the non-uniform etch depth in the substrate may include at least 8 different depth levels. A maximum depth of the non-uniform etch depth in the substrate may be greater than about 100 nm.

In some embodiments, the method may also include at least one of depositing a first anti-reflective coating layer on the patterned etch mask before depositing the photoresist material layer, or depositing a second anti-reflective coating layer on the photoresist material layer after depositing the photoresist material layer. In some embodiments, the first anti-reflective coating layer and/or the second anti-reflective coating layer may have etch rates comparable to the etch rate of the patterned photoresist layer or the etch rate of the substrate in a same etching process.

In some embodiments, the photoresist material layer may be sensitive to light having a wavelength shorter than about 300 nm, 250 nm, 193 nm, or 157 nm. In some embodiments, the etch rate of the patterned photoresist layer may be between about 0.5 and about 5 times of the etch rate of the substrate in a same etching process. In some embodiments, the photoresist material layer may be characterized by a linear response to UV light dose such that a depth of an exposed portion of the photoresist material layer may be a linear function of the UV light dose. The photoresist material layer may include, for example, a positive-tone photoresist. In some embodiments, the photoresist material layer may include Poly(methyl methacrylate) (PMMA) sensitized with a photosensitive group. The photosensitive group may include at least one of an acyloximino group, methacrylonitrile, terpolymer of methyl methacrylate, oximino methacrylate, benzoic acids, N-acetylcarbazole, or indenone. In some embodiments, the photoresist material layer may include at least one of poly(methyl methacrylate)-r-poly(tert-butyl methacrylate)-r-poly(methyl methacrylate) and a photo acid generator, poly(methyl methacrylate)-r-poly(methacrylic acid), poly(α-methylstyrene-co-methyl chloroacrylate) and an acid generator, polycarbonate and a photo acid or base generator, polylactide and a photo acid or base generator, or polyphthalaldehyde and a photo acid generator.

According to certain embodiments, a slanted surface-relief structure for waveguide display may include a substrate and a slanted surface-relief optical grating in the substrate. The slanted surface-relief optical grating may include a plurality of grating ridges and a plurality of grating grooves, where each of the plurality of grating grooves is characterized by a corresponding depth. Depths of the plurality of grating grooves include at least 8 different depth levels. A slant angle of at least one grating ridge in the plurality of grating ridges is greater than 30° with respect to a surface normal of the substrate.

In some embodiments, the depths of the plurality of grating grooves may range from 0 nm to greater than about 100 nm. The depths of the plurality of grating grooves may vary in one or two directions across the slanted surface-relief optical grating according to a predetermined profile. The slanted surface-relief optical grating may have different grating duty cycles at different regions of the slanted surface-relief optical grating. For example, the slanted surface-relief optical grating may be characterized by a maximum duty cycle greater than 70% or a minimum duty cycle less than 30%. The slanted surface-relief optical grating may have different grating periods at different regions of the slanted surface-relief optical grating.

According to certain embodiments, a photoresist material for fabricating a variable-etch-depth grating may be sensitive to light with a wavelength shorter than 300 nm and may be characterized by an etch rate that is between 0.5 and 5 times of an etch rate of a substrate, such as a silicon nitride substrate. The photoresist material may be characterized by a linear response to UV light dose such that a depth of an exposed portion of the photoresist material is a linear function of the UV light dose. In some embodiments, the photoresist material includes at least one of Poly(methyl methacrylate) (PMMA) sensitized with a photosensitive group, poly(methyl methacrylate)-r-poly(tert-butyl methacrylate)-r-poly(methyl methacrylate) and a photo acid generator, poly(methyl methacrylate)-r-poly(methacrylic acid), poly(α-methylstyrene-co-methyl chloroacrylate) and an acid generator, polycarbonate and a photo acid or base generator, polylactide and a photo acid or base generator, or polyphthalaldehyde and a photo acid generator.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 5A-5B illustrate cross-sectional views of an example of a slanted variable-etch-depth grating coupler in a waveguide display according to certain embodiments.

FIG. 7A-7F illustrate an example of a process for fabricating a variable-etch-depth grating according to certain embodiments.

Figure 1:
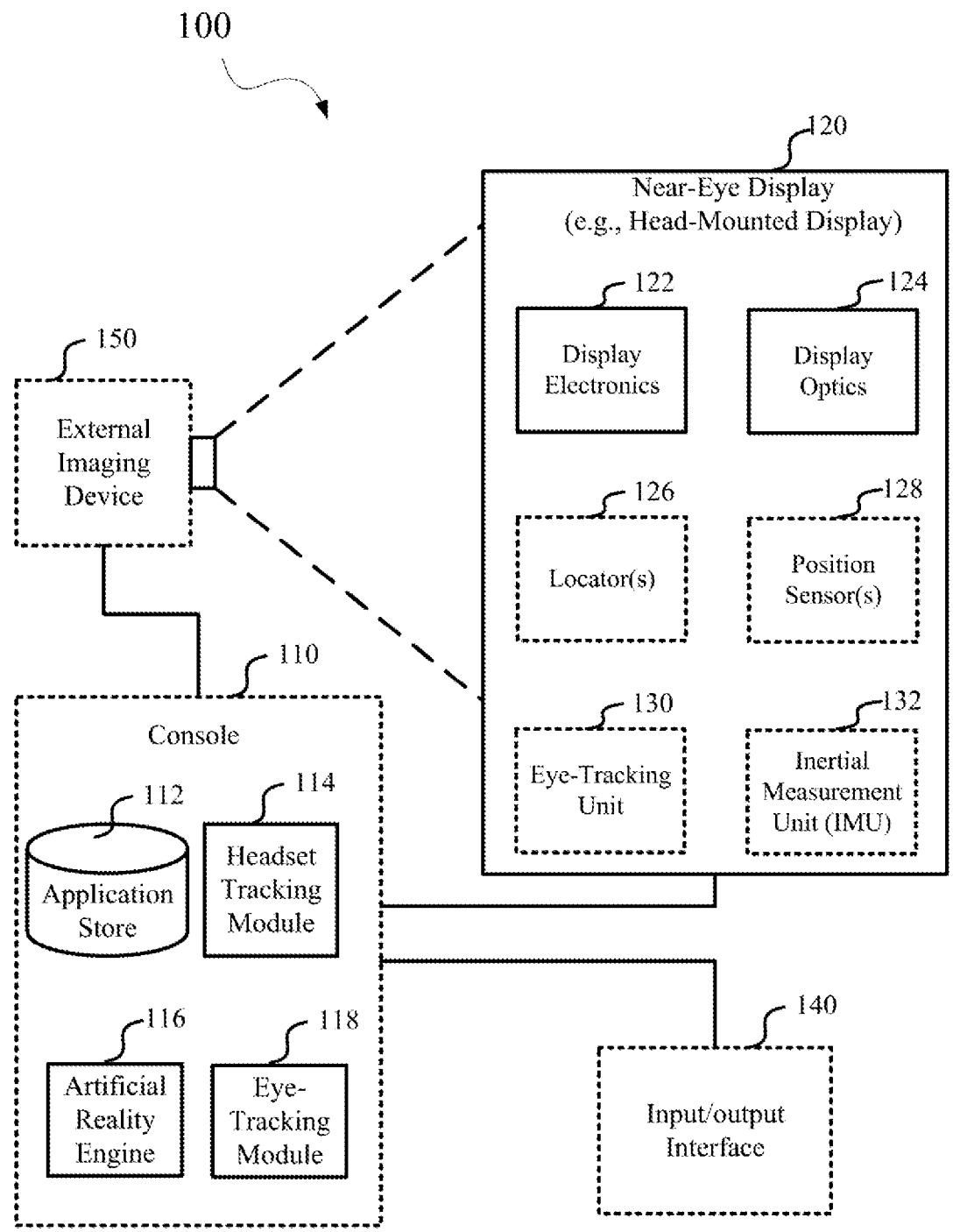
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to waveguide-based near-eye display systems. More specifically, and without limitation, disclosed herein are techniques for fabricating a straight or slanted grating structure having a variable etch depth, a variable duty cycle, and/or a variable grating period for a waveguide-based near-eye display system. Various inventive embodiments are described herein, including devices, systems, methods, materials, and the like.

Gratings may be used in a waveguide-based near-eye display system for coupling light into or out of a waveguide. In some waveguide-based near-eye display systems, in order to improve the field of view, improve the efficiency of light transfer, increase the brightness or power efficiency, reduce display artifacts (e.g., rainbow artifacts), achieve different diffraction characteristics (e.g., diffraction efficiencies and/or diffraction angles) at different areas of the grating, and/or improve other performance of the waveguide-based near-eye display systems, a grating may need to have a three-dimensional profile that is not uniform in the x, y, and/or z directions. For example, the grating ridges may need to be slanted, the depth of the grating grooves may need to be different at different regions of the grating, the grating period and/or duty cycle of the grating may need to be different at different regions of the grating, and the like. While some lithographic techniques (e.g. photolithography, electron-beam lithography, etc.) can produce gratings with a customizable duty cycle and/or grating period, these lithographic techniques generally are not capable of modulating the vertical dimension (i.e., etch depth) of the grating relative to the surface of the substrate over the entire area of the grating.

According to certain embodiments, two mask layers may be used to manufacture a grating (or a nanoimprint mold) with a 3-D profile, where the physical dimensions of the grating may vary in the x, y, and/or z directions. A first mask layer may include a thin hard mask that is used to define a 2-dimensional pattern (e.g., in x-y plane). The second mask layer may include a photoresist material (e.g., a positive-tone photoresist) that has a linear response to exposure dose, and may have an etch rate similar to or faster than the underlying substrate in a same etching process. The second mask layer may be exposed to light (e.g., UV light) through a gray-scale photomask that modulates the exposure dose over the area of the second mask layer. The gray-scale photomask may have a light transmittance that varies in one or two directions (e.g., in x and/or y directions). As such, different areas (e.g., at different x and/or y locations) of the second mask layer may have different thicknesses after the photoresist development. The second mask layer and the substrate may be etched (e.g., by a slanted etching process) in the same etching process to transfer the thickness profile of the second mask layer to the substrate to form a straight or slanted grating having the desired 3-D profile, such as a variable-etch-depth grating, in the substrate.

To achieve a continuous thickness profile or a thickness profile that includes many different levels of depth, the photoresist material for the second mask layer may need to both be sensitive to the exposure light (e.g., UV light) and have a low contrast or a linear response to exposure dose such that different exposure doses can correspond to different depths of the exposed portions of the photoresist material. The exposed portions may be more soluble in a photoresist developer and thus may be removed after the development to leave photoresist material of different depths in different areas. The photoresist material may also have an etch rate similar to or greater than the etch rate of the substrate (e.g., quartz or $Si_3N_4$) using a same etching process, such that the thickness profile of the photoresist material may be transferred to the substrate by the etching process. In some embodiments, the photoresist material may be a material that is removable by plasma, such as an organic material rather than an inorganic material.

In some cases, light reflected at the interfaces between the photoresist material and media adjacent to the photoresist material, such as the substrate or air, may cause standing waves in the photoresist material, reduce the depth of focus, or increase the variability and non-uniformity of the manufactured straight or slanted grating having the desired 3-D profile, such as a variable-etch-depth grating. According to certain embodiments, to increase the resolution of the gray tone photolithography and improve the uniformity of the manufactured gratings, one or more anti-reflective layers may be coated under and/or above the photoresist material for the second mask layer. The anti-reflective layers coated at the surfaces of the photoresist material may help to reduce the light reflection at the interfaces between the photoresist material and adjacent media. For example, the anti-reflective layers may cause destructive interference between the reflected light or may absorb light passing through the anti-reflective layers to reduce the light reflections. In some embodiments, the anti-reflective layers, such as a bottom anti-reflective coating (BARC) layer may have an etch rate comparable to (e.g., approximately similar to) the etch rate of the photoresist material or the substrate (e.g., quartz or $Si_3N_4$) using a same etching process.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2-4. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (mLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light. In some embodiments, at least some of the functions of eye-tracking module 118 may be performed by eye-tracking unit 130.

Figure 2:
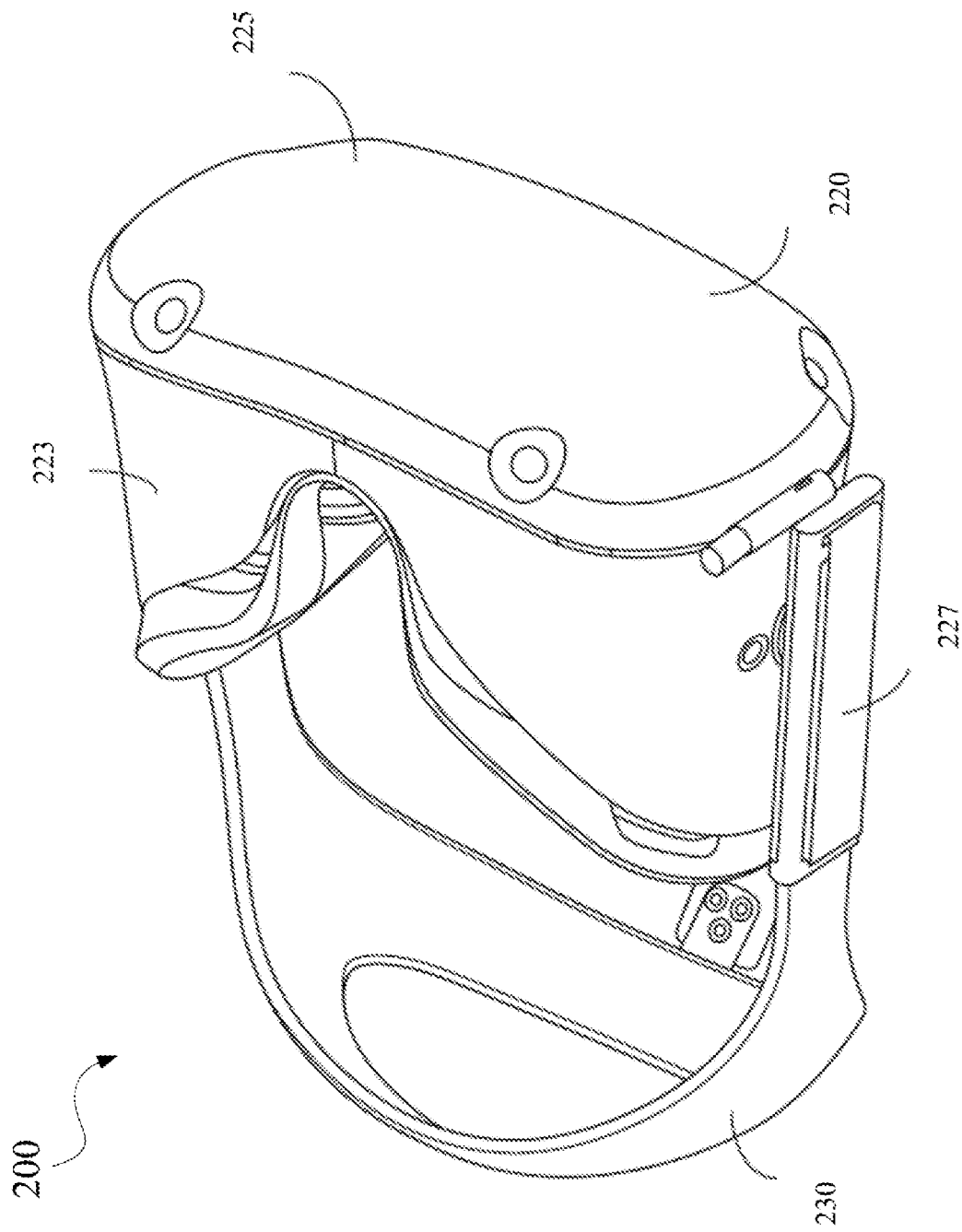
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
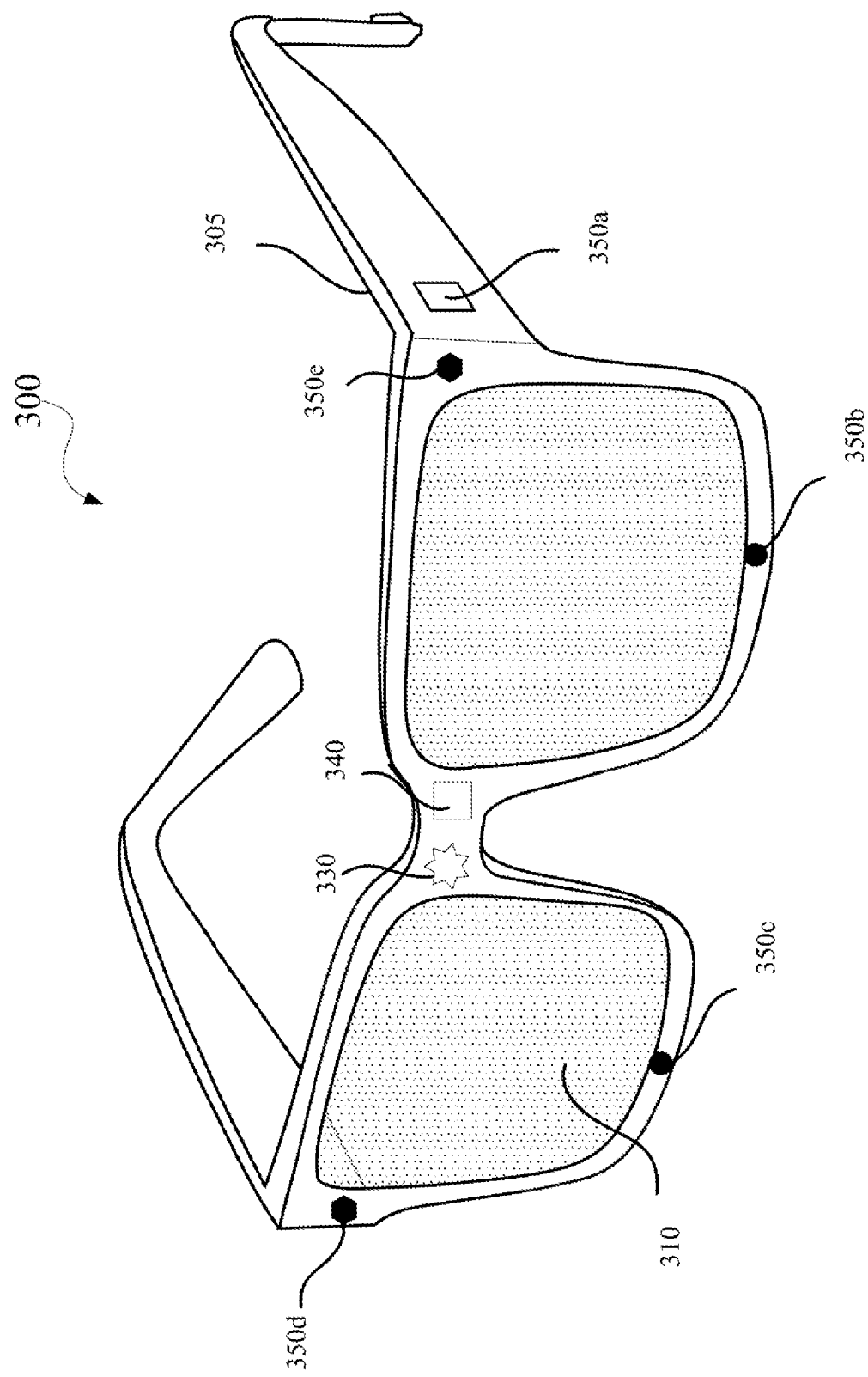
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350*a*-350*e* may be used as input devices to control or influence the displayed content of near-eye display 300, and/or to provide an interactive VR/AR/MR experience to a user of near-eye display 300. In some embodiments, sensors 350*a*-350*e* may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350*a*-350*e* in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
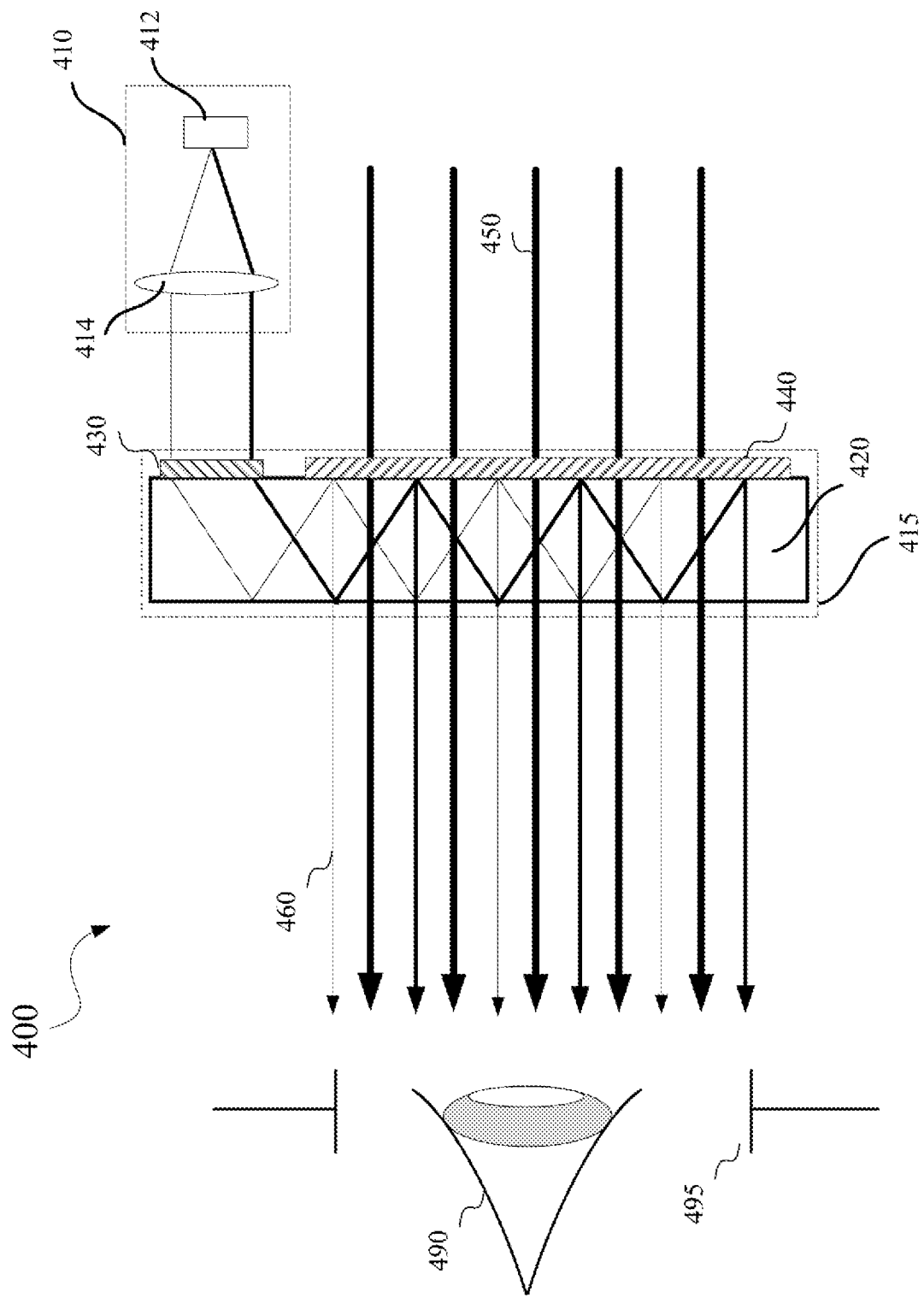
FIG. 4 illustrates an example of an optical see-through augmented reality system using a waveguide display according to certain embodiments.

FIG. 4 illustrates an example of an optical see-through augmented reality system 400 using a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), or a refractive coupler (e.g., a wedge or a prism). Input coupler 430 may have a coupling efficiency of greater than 30%, 50%, 75%, 90%, or higher for visible light. As used herein, visible light may refer to light with a wavelength between about 380 nm to about 750 nm. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of substrate 420 may range from, for example, less than about 1 mm to about 10 mm or more. Substrate 420 may be transparent to visible light. A material may be "transparent" to a light beam if the light beam can pass through the material with a high transmission rate, such as larger than 50%, 40%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 420 may include or may be coupled to a plurality of output couplers 440 configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

In many applications, to diffract light at a desired direction towards the user's eye, to achieve a desired diffraction efficiency for certain diffraction orders, to increase the field of view and reduce rainbow artifacts of a waveguide display, a grating coupler (e.g., input coupler 430 or output couplers 440) may include a blazed or slanted grating, such as a slanted surface-relief grating, where the grating ridges and grooves may be tilted relative to the surface normal of the grating coupler or waveguide. In addition, in some embodiments, it may be desirable that the grating has a height or depth profile that is non-uniform over the area of the grating, and/or a grating period or duty cycle that varies across the grating, in order to improve the performance of the grating, such as to achieve different diffraction characteristics (e.g., diffraction efficiencies and/or diffraction angles) at different areas of the grating.

FIGS. 5A-5B illustrate cross-sectional views of an example of a slanted grating 520 used in an example waveguide display 500 according to certain embodiments. Waveguide display 500 may include slanted grating 520 on a waveguide 510, such as substrate 420. Slanted grating 520 may act as a grating coupler for couple light into or out of waveguide 510. In some embodiments, slanted grating 520 may include a structure with a period p, which may be a constant or may vary across the area of slanted grating 520. Slanted grating 520 may include a plurality of ridges 522 and a plurality of grooves 524 between ridges 522. Each period of slanted grating 520 may include a ridge 522 and a groove 524, which may be an air gap or a region filled with a material with a refractive index different from the refractive index of ridge 522. The ratio between the width of a ridge 522 and the grating period p may be referred to as the duty cycle. Slanted grating 520 may have a duty cycle ranging, for example, from about 30% to about 70%, or from about 10% to about 90% or greater. In some embodiments, the duty cycle may vary from period to period or from area to area. In some embodiments, the period p of the slanted grating may vary from one area to another on slanted grating 520, or may vary from one period to another (i.e., chirped) on slanted grating 520.

Ridges 522 may be made of a material, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 522 may include a leading edge 530 with a slant angel α and a trailing edge 540 with a slant angle β. In some embodiments, leading edge 530 and trailing edge 540 of each ridge 522 may be parallel to each other. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger, such as about 45° or larger. In some embodiments, slant angle α and/or slant angle β may also vary from ridge to ridge in slanted grating 520.

Each groove 524 may have a depth d in the z direction, which may be a constant or may vary across the area of slanted grating 520 as illustrated by an example of a depth profile 560 in a y-z plane shown in FIG. 5B (e.g., along a line A-A in FIG. 5A). In embodiments where slanted grating 520 is a two-dimensional grating, the cross-sectional view of the y-z plane may show a plurality of grating grooves 524. In embodiments where slanted grating 520 is a one-dimensional grating, the cross-sectional view of the y-z plane may not show a plurality of grating grooves 524. In some embodiments, the depths of grooves 524 may vary across the area of slanted grating 520 according to a pattern or a depth profile 550 in an x-z plane. In some embodiments, the depths of grooves 524 may include multiple depth levels, such as 8 depth levels, 16 depth levels, 32 depth levels, or more. In some embodiments, the depths of grooves 524 may vary from 0 to about 100 nm, 200 nm, 300 nm, or deeper. In some implementations, grooves 524 between ridges 522 may be over-coated or filled with a material having a refractive index higher or lower than the refractive index of the material of ridges 522. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 524. In some embodiments, a low refractive index material, such as silicon oxide, alumina, porous silica, or fluorinated low index monomer (or polymer), may be used to fill grooves 524. As a result, the difference between the refractive index of the ridges and the refractive index of the grooves may be greater than 0.1, 0.2, 0.3, 0.5, 1.0, or higher.

As such, slanted grating 520 may have a 3-D structure, the physical dimensions of which may vary in the x, y, and/or z directions. For example, the grating period or duty cycle of slanted grating 520 may vary in the x-y plane and may also vary in the z-direction if slant angle α is different from slant angle β. The depths of grooves 524 in the z direction may vary in the x and/or y directions. In some embodiments, the slant angle α and/or β with respect to the z direction may also vary along the x and/or y directions in slanted grating 520.

It may be challenging to fabricate the slant grating shown and described above with respect to FIG. 5. For example, many grating etching processes may only uniformly etch a substrate to fabricate a grating with a uniform thickness or depth. In some etching processes, the etch rate and thus the depth of the grating may depend on the duty cycle of the grating to be etched. As such, even if non-uniform depths can be achieved using such etching processes, the etch depths may depend on other physical dimensions (e.g., the duty cycle or period) of the grating and thus the grating may not have the desired 3-D profile.

According to certain embodiments, two mask layers may be used to manufacture a grating (or a nanoimprint mold) with a 3-D profile, where the dimensions of the grating may vary in the x, y, and/or z directions. A first mask layer may be a thin hard mask that is used to define a 2-dimensional pattern (e.g., in x-y plane). The second mask layer may include a photoresist material (e.g., a positive-tone photoresist) that has a linear response to exposure dose, and may have an etch rate similar to or faster than the underlying substrate in a same etching process. The second mask layer may be exposed to light (e.g., UV light) through a gray-scale photomask that modulates the exposure dose over the area of the second mask layer. The gray-scale photomask may have a light transmittance that varies in one or two directions (e.g., in x and/or y directions). As such, different areas (e.g., at different x and/or y locations) of the second mask layer may have different exposure depths and thus different thicknesses after the photoresist development. The second mask layer and the substrate may be etched (e.g., by a slanted etching process) to transfer the thickness profile of the second mask layer to the substrate to form a straight or slanted grating having the desired 3-D profile, such as a variable-etch-depth grating, in the substrate.

To fabricate a variable-etch-depth grating having a continuous thickness profile or a thickness profile that includes many different depth levels, the photoresist material for fabricating the variable-etch-depth grating may need to be sensitive to UV light (e.g., with a wavelength shorter than 365 nm or 300 nm, such as 240-280 nm, 193 nm, or 157 nm) and may have an etch rate similar to or higher than the etch rate of a substrate in which the variable-etch-depth grating is to be fabricated. The photoresist material may have a linear response to UV exposure dose such that a depth of an exposed portion of a photoresist material layer including the photoresist material may correlate with the exposure dose, such as being a linear function of the exposure dose. The photoresist material layer including the photoresist material may be deposited on a substrate having an attached etch mask that defines a two-dimensional pattern of a grating. The photoresist material layer may be exposed to UV light through a gray-scale photomask. After the exposure and development, the photoresist material layer may have a non-uniform thickness where the thickness may vary according to a desired pattern. The photoresist material layer with the patterned non-uniform thickness and the underlying substrate may be etched straightly or at a certain slant angle to form a straight or slanted grating structure in the substrate, where the grating structure may have a non-uniform depth profile corresponding to the non-uniform thickness of the photoresist material layer before etching. Because the two-dimensional pattern of the grating can be defined by the etch mask, the depth profile of the grating can be defined by the gray-scale photomask, and the slant angle of the grating at a region of the grating can be defined by the etch angle for the region, a grating with a desired 3-D structure can be fabricated using the techniques disclosed herein.

To achieve a continuous thickness profile or a thickness profile that includes many different levels of depth, the photoresist material for the second mask layer needs to have a low contrast and linear response to exposure dose such that different exposure doses can correspond to different exposure depths, where the exposed portions may be more soluble in the developer and thus may be removed after the development to leave photoresist material of different depths in different areas. The photoresist material may also have an etch rate similar to or greater than the etch rate of the substrate (e.g., quartz or $Si_3N_4$) using a same etching process, such that the thickness profile of the photoresist material may be transferred to the substrate by the etching process. In some embodiments, the photoresist material may be a material that is removable by plasma, such as an organic material rather than an inorganic material.

In some cases, during photolithography, exposure light may be reflected at the interfaces between the photoresist material layer and media adjacent to the photoresist material, such as the substrate or air. The light reflected at different surfaces of the photoresist material layer may at least partially constructively interfere with each other to increase overall reflection or interfere with the exposure light to cause standing waves in the gray-scale photoresist material, decrease exposure latitude, reduce the depth of focus, cause reflective notching, change the dimensions of the features formed in the gray-scale photoresist material, and/or increase the variability and non-uniformity of the straight or slanted grating having the desired 3-D profile, such as a variable-etch-depth grating. For example, in some cases, light reflected at the top and bottom surface of the photoresist material layer may at least partially constructively interfere with each other to increase the overall reflection. In some cases, light reflected at the bottom surface of the photoresist material layer may interfere with the exposure light propagating in the photoresist material layer to form standing waves (and thus light intensity distribution in the thickness direction) in the photoresist material layer. The light intensity distribution in the photoresist material layer may cause the width of the features formed in the photoresist material layer after the development to vary in the thickness direction of the photoresist material layer, thereby forming ripples in the sidewalls of the features in the photoresist material layer. The ripples cam change the lateral dimensions of the features, and may also cause diffusion of the etching beams during etching using the photoresist material layer as etch mask.

According to certain embodiments, to reduce light reflection, increase the resolution of the gray tone photolithography, increase the depth of focus, and improve the uniformity of the manufactured gratings, one or more anti-reflective layers may be coated under and/or above the photoresist material for the second mask layer. The anti-reflective layers coated at the surfaces of the photoresist material may help to reduce the light reflection at the interfaces between the photoresist material and adjacent media. For example, the anti-reflective layers may cause destructive interference between light reflected at different surfaces of the anti-reflective layers, or may absorb light passing through the anti-reflective layers to reduce the light reflection at the bottom surface of the anti-reflective layers. In some embodiments, the anti-reflective layers, such as a bottom anti-reflective coating (BARC) layer, may have an etch rate comparable to (e.g., approximately similar to) the etch rate of the photoresist material or the substrate (e.g., quartz or $Si_3N_4$) using a same etching process.

Figure 6:
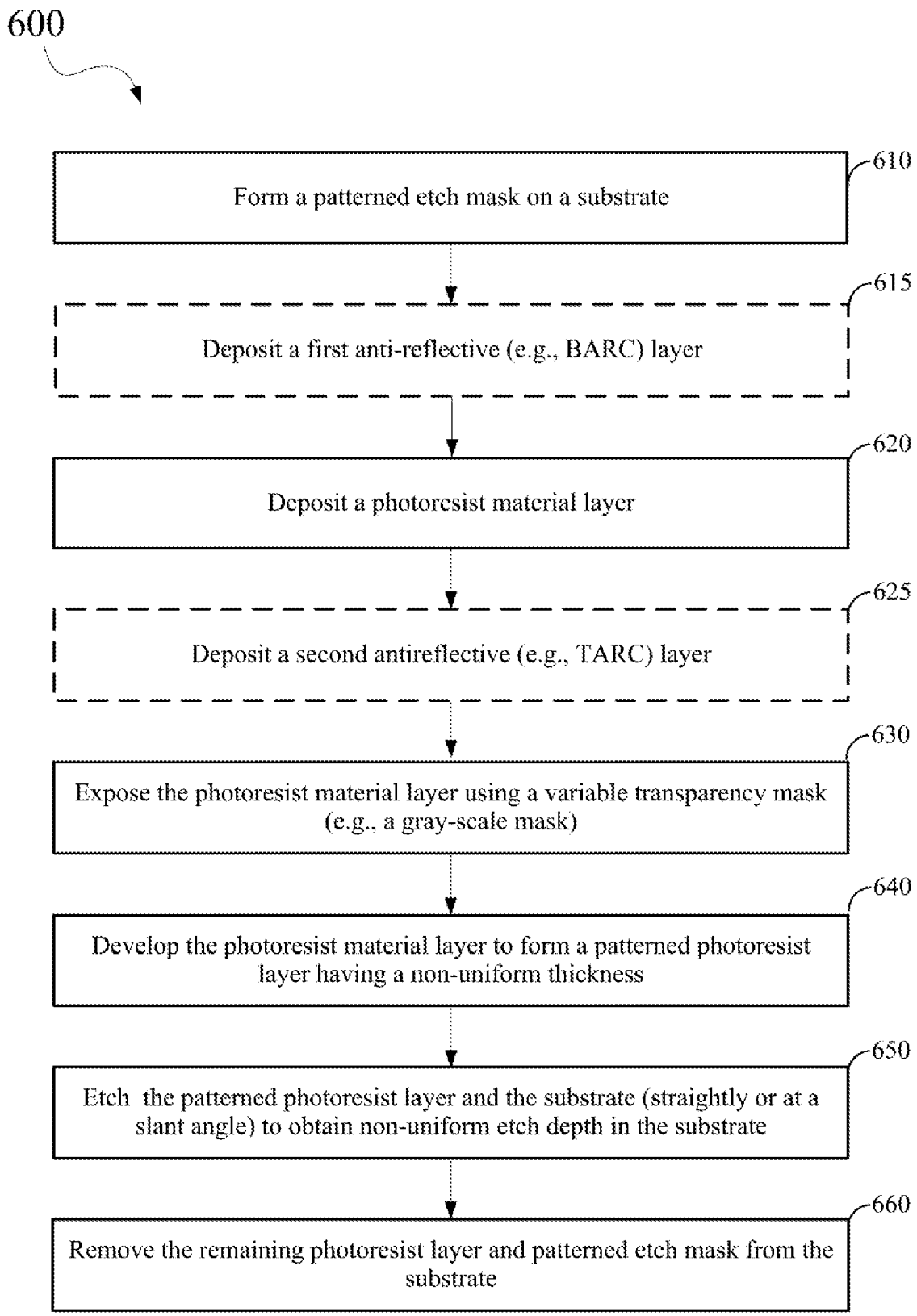
FIG. 6 illustrates an example of a method of fabricating a variable-etch-depth grating according to certain embodiments.

FIG. 6 is a flow chart 600 illustrating an example of a method of fabricating a variable-etch-depth grating according to certain embodiments. The operations described in flow chart 600 are for illustration purposes only and are not intended to be limiting. In various implementations, modifications may be made to flow chart 600 to add additional operations or to omit some operations. The operations described in flow chart 600 may be performed by, for example, one or more semiconductor fabrication systems that include a patterning system, a deposition system, an etching system, or any combination thereof.

At block 610, a patterned etch mask (e.g., a hard mask) may be formed on a substrate. The patterned etch mask may include a 2-D pattern (e.g., in a horizontal or x-y plane perpendicular to the surface-normal of the substrate) that matches the 2-D pattern of the grating to be manufactured. For example, the patterned etch mask may have the same grating periods and duty cycles as the grating periods and duty cycles of the grating to be manufactured. The patterned etch mask may have a very low etch rate, and, in some embodiments, may include a metal material, such as Cr. In some embodiments, the patterned etch mask may be formed by a lithography process. For example, an etch mask layer may be deposited on the substrate; a photoresist layer may be deposited on the etch mask layer and exposed to light through a photomask; the exposed photoresist layer may be developed to form the desired pattern in the photoresist layer; and an etching process may then be performed to transfer the desired pattern in the photoresist layer onto the etch mask layer. In some embodiments, the etch mask layer may be pre-manufactured and then laminated onto the substrate. In some embodiments, the patterned etch mask may be formed by a laser ablation, an electron beam lithography, an interference lithography, a multi-photon lithography, a scanning probe lithography, or some combinations thereof.

Optionally, at block 615, a deposition system may deposit an anti-reflective layer (e.g., a bottom anti-reflective coating (BARC) layer) on the patterned etch mask. The deposition may include, for example, spin coating, spray coating, physical vapor deposition, chemical vapor deposition, an atomic layer deposition, or the like. In some embodiments, the anti-reflective layer may include one or more dielectric layers that may cause destructive interferences between light reflected at different surfaces of the one or more dielectric layers to reduce the effective reflection of the anti-reflective layer. In some embodiments, alternatively or additionally, the anti-reflective layer may include an absorptive material that may absorb the light used for photolithography to attenuate the exposure light passing through the anti-reflective layer, thereby reducing the light reflection at the interface between the anti-reflective layer and the substrate (or the patterned etch mask). The anti-reflective layer may have an etch rate comparable to (e.g., similar to or slightly lower or greater than) the etch rate of the substrate, such as quartz, silicon, silicon nitride, and the like.

At block 620, a deposition system may deposit a photoresist material layer on the patterned etch mask. The deposition may include, for example, spin coating, spray coating, physical vapor deposition, chemical vapor deposition, an atomic layer deposition, or the like. The photoresist material layer may include a positive-tone photoresist material, which, upon exposure, may become more soluble in a photoresist developer, such that the exposed portions of the photoresist material layer may be removed by the development process. The photoresist material may also have a linear response to exposure dose such that the depth of an exposed portion of the photoresist material layer may correlate with the exposure dose at the exposed portion. The photoresist material may further be characterized by an etch rate comparable to (e.g., similar to or greater than) the etch rate of the substrate, such as quartz, silicon, silicon nitride, and the like. More details of suitable photoresist materials are described below.

Optionally, at block 625, a deposition system may deposit an anti-reflective layer (e.g., a top anti-reflective coating (TARC)) on the photoresist material layer. The deposition may include, for example, spin coating, spray coating, physical vapor deposition, chemical vapor deposition, an atomic layer deposition, or the like. In some embodiments, the TARC layer may include one or more dielectric layers that may cause destructive interferences between light reflected at different surfaces of the one or more dielectric layers to reduce the effective reflection of the anti-reflective layer. In some embodiments, the TARC layer may have an etch rate comparable to (e.g., similar to or slightly lower or greater than) the etch rate of photoresist material or the substrate, such as quartz, silicon, silicon nitride, and the like.

At block 630, the photoresist material layer may be exposed to ultra-violet (UV) light or deep UV light through a variable transparency photomask (e.g., a gray-scale photomask). The variable transparency photomask may be characterized by a transmissivity function correlated with the desired depth profile on the photoresist material layer or the desired depth profile of the grating (or nanoimprint mold) to be fabricated. For example, the variable transparency photomask may include multiple levels of light transmission rate or may include a continuously varying light transmission rate. In some embodiments, the variable transparency photomask may include a metal layer or another partially UV-blocking material layer having a varying thickness. Therefore, the variable transparency photomask may selectively transmit UV radiation of different intensity levels to modulate the dose of UV radiation on the photoresist material layer and thus the exposure depth of the photoresist material layer.

At block 640, the exposed photoresist material layer is developed using a photoresist developer to remove (e.g., dissolve) the exposed portions from the photoresist material layer and form a patterned photoresist layer having a non-uniform thickness. The development process can include immersion development, puddle development, spray development, and the like. The photoresist developer may include, for example, a diluted sodium hydroxide or potassium hydroxide solution, an aqueous solution of metal-ion-free organic TetraMethylAmmoniumHydroxide (TMAH), or an organic solvent.

At block 650, the patterned photoresist layer and the substrate may be etched to transfer the thickness profile of the patterned photoresist layer into the substrate, thus achieving the non-uniform etch depth in the substrate. The etching may include straight etching or slanted etching. The etching may include, for example, a wet etching, an ion milling, a plasma based reactive ion etching, or some combinations thereof. The wet etching may include a chemical etching using a combination of acids, bases, and solvents at a range of temperatures and concentrations. The ion milling may include a physical removal of a portion of the patterned photoresist layer and the substrate at a low pressure and using a high accelerating potential such that electrons may be accelerated to impact gas atoms with enough energy to ionize the gas atoms. The plasma-based reactive ion etching (RIE) may use a chemically reactive plasma at a low pressure and an electromagnetic field to remove portions of the patterned photoresist layer and the substrate. In any of these etching techniques, the etch rate of the photoresist material may be similar to or greater than the etch rate of the substrate in order to transfer the thickness profile of the patterned photoresist layer to the substrate. For example, the etch rate of the patterned photoresist layer may be between about 0.5 to about 5 times of the etch rate of the substrate, between about 0.6 to about 3 times of the etch rate of the substrate, between about 0.7 to about 2 times of the etch rate of the substrate, between about 0.8 to about 1.5 times of the etch rate of the substrate, between about 0.9 to about 1.2 times of the etch rate of the substrate, and the like.

At block 660, the remaining photoresist (if any) and the patterned etch mask may be removed from the substrate using one or more solvents or other removers or strippers to expose the substrate that includes a grating structure with varying depth etched therein. The grating structure may be a final product of a variable-etch-depth grating or may be used as a master mold for imprinting variable-etch-depth gratings.

FIG. 7A-7F illustrate an example of a process 700 for fabricating a variable-etch-depth grating according to certain embodiments. Process 700 may be similar to the method described above with respect to FIG. 6. FIG. 7A shows a substrate 710 (e.g., $Si_3N_4$) having a metal grating mask 720 (e.g., a hard mask, such as chromium-based metal grating mask) and a photoresist material layer 730 formed thereon. Photoresist material layer 730 may include a low contrast photoresist. FIG. 7B shows that photoresist material layer 730 is exposed to UV light 750 through a gray-scale photomask 740. UV light 750 may have a wavelength shorter than 300 nm, such as between about 240 nm and 280 nm, at 193 nm, at 157 nm, or lower (e.g., at a deep UV wavelength). Gray-scale photomask 740 may include a transparent substrate and a layer having a UV light transmissivity varying across its area. As illustrated, in areas of photoresist material layer 730 corresponding to areas of gray-scale photomask 740 that have higher transmissivity, the depth of the exposed portions 732 of photoresist material layer 730 may be higher. FIG. 7C shows that a patterned photoresist layer 734 is formed in photoresist material layer 730 after the development and removal of exposed portions 732.

FIG. 7D shows an ion etching process that etches portions of patterned photoresist layer 734 and, in some areas, etches portions of substrate 710. The etch depth of substrate 710 is the highest in areas of substrate 710 that correspond to areas of patterned photoresist layer 734 with the lowest thickness. FIG. 7E shows that patterned photoresist layer 734 is completely etched or the remaining portion 736 of patterned photoresist layer 734 has been removed by a remover (e.g., a solvent) or a stripper. As illustrated in FIG. 7E, the depths of a grating 712 in substrate 710 may be different in different areas of substrate 710. FIG. 7F shows that metal grating mask 720 has been removed to expose grating 712 in substrate 710.

As described above, to etch a surface-relief grating having a continuous depth profile or a depth profile that includes many different depth levels, the photoresist material for the second mask layer needs to both be sensitive to exposure light (e.g., UV light) and have a low contrast or linear response to exposure dose. The photoresist material may also need to have an etch rate similar to or greater than the etch rate of the substrate (e.g., $Si_3N_4$) during a same etching process, such that the thickness profile of the photoresist material achieved through exposure and development processes may be transferred to the substrate by the etching process. Conventional photoresists may be photosensitive, but are generally designed to have much slower etch rates than the underlying materials to be etched. In addition, some conventional photoresists may not have a linear response to exposure dose and thus may not be able to achieve a continuous depth profile or a depth profile that includes many different depth levels after exposure and development. Some materials may have etch rates similar to the etch rate of underlying materials to be etched, but may not be photosensitive. Thus, these materials may not be suitable for use as gray-scale photoresists for variable depth etching.

According to certain embodiments, a sensitized Poly (methyl methacrylate) (PMMA) is used as the low contrast (gray-scale) photoresist material. PMMA can be used as a low-contrast and low-etch-selectivity e-beam resist. PMMA may also have an etch rate comparable to some substrate materials. Some PMMA materials may be sensitive to deep UV (DUV) light, but the sensitivity may be low, and thus the exposure process may be slow. For example, it may take hours to pattern a PMMA photoresist layer even using DUV light. According to some embodiments, a PMMA material may be sensitized to make a photoresist material that has an etch rate similar to the etch rate of the substrate and has a higher sensitivity to DUV light or UV light, such that low exposure dose may be sufficient for the exposure.

Figure 8A:
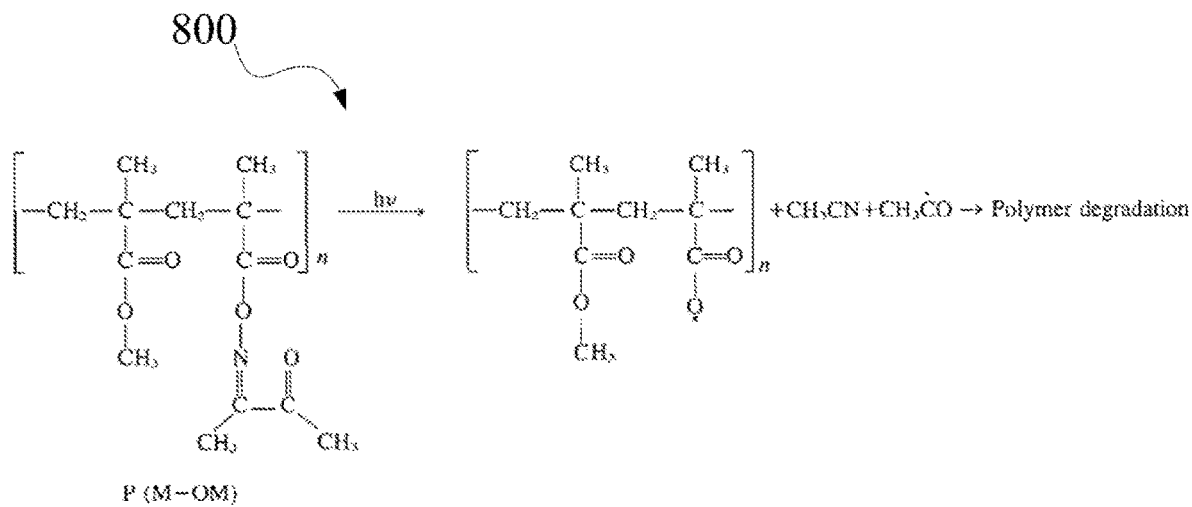
FIG. 8A illustrates an example of a photoresist material for fabricating variable-etch-depth gratings according to certain embodiments.

FIG. 8A illustrates an example of a photoresist material 800 for etching variable-etch-depth gratings according to certain embodiments. Photoresist material 800 may include the PMMA material and a small amount of photosensitive groups that would lead to backbone cleavage. Thus, photoresist material 800 can have a good film-forming property and high resolution. One example of the photosensitive groups is the acyloximino group, such as acyloximino ester chromophore. Acyloximino monomers can be incorporated into PMMA to form a composite with increased photosensitivity. In some embodiments, other materials, such as methacrylonitrile, terpolymer of methyl methacrylate, oximino methacrylate, benzoic acids, n-acetylcarbazole, indenone, and the like, may also be incorporated into the composite to further improve the photosensitivity of the photoresist material. FIG. 8A shows a Poly (methyl methacrylate-co-3-oximino-2-butanone methacrylate) (P(M-OM) composite, which, when exposed to UV light, may experience backbone cleavage and photo-degradation.

In some embodiments, a material including poly(methyl methacrylate)-r-poly(tert-butyl methacrylate)-r-poly(methyl methacrylate) (PMMA-r-PtBMA-r-PMAA) and photo acid generator (PAG) may be used as the gray-scale photoresist material for forming the patterned photoresist layer that has the non-uniform thickness. The PMMA-r-PtBMA-r-PMAA+PAG material may be sensitive to light at 193 nm or DUV wavelength, and may also have a low etch selectivity. In some embodiments, a material including poly(methyl methacrylate)-r-poly(methacrylic acid) (PMMA-r-PMAA) may be used as the gray-scale photoresist material.

Figure 8B:
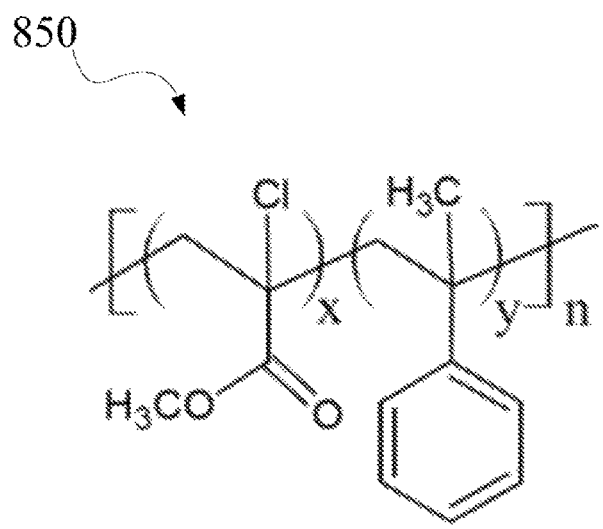
FIG. 8B illustrates an example of a photoresist material for fabricating variable-etch-depth gratings according to certain embodiments.

FIG. 8B illustrates another example of a photoresist material 850 for etching variable-etch-depth grating according to certain embodiments. Photoresist material 850 may include a positive-tone e-beam resist, such as CSAR 62 from AllResist Gmbh. CSAR 62 can be used as the gray-scale photoresist material for forming the patterned photoresist layer that has the variable thickness because CSAR 62 is sensitive to DUV light and has a relatively low contrast. CSAR 62 includes poly(α-methylstyrene-co-methyl chloroacrylate) and an acid generator. CSAR 62 may have a higher etch selectivity than PMMA, but the etch selectivity of CSAR 62 may be optimized by tuning the etch gas chemistries.

In some embodiments, optimized polycarbonates can be used as the gray-scale photoresist material for forming the patterned photoresist layer that has the variable thickness. Polycarbonates are highly etch labile and can break down under the presence of acids generated from PAG or the presence of bases generated from photo base generator (PBG). In some embodiments, a polyester-based resist that includes polylactic acid (i.e., polylactide or PLA) and PAG can be used as the gray-scale photoresist material for forming the patterned photoresist layer that has the variable thickness. The polyester-based resist, such as polylactide, may break down in the presence of acids from PAG or bases from PBG. In some embodiments, the gray-scale photoresist material may include polyphthalaldehyde, which may be highly etch labile and can break down in the presence of PAG.

In some embodiments, epoxy resins (e.g. SU-8), novolac resins, SSQ derivatives, and the like, may be used as the gray-scale photoresist material.

Figure 9:
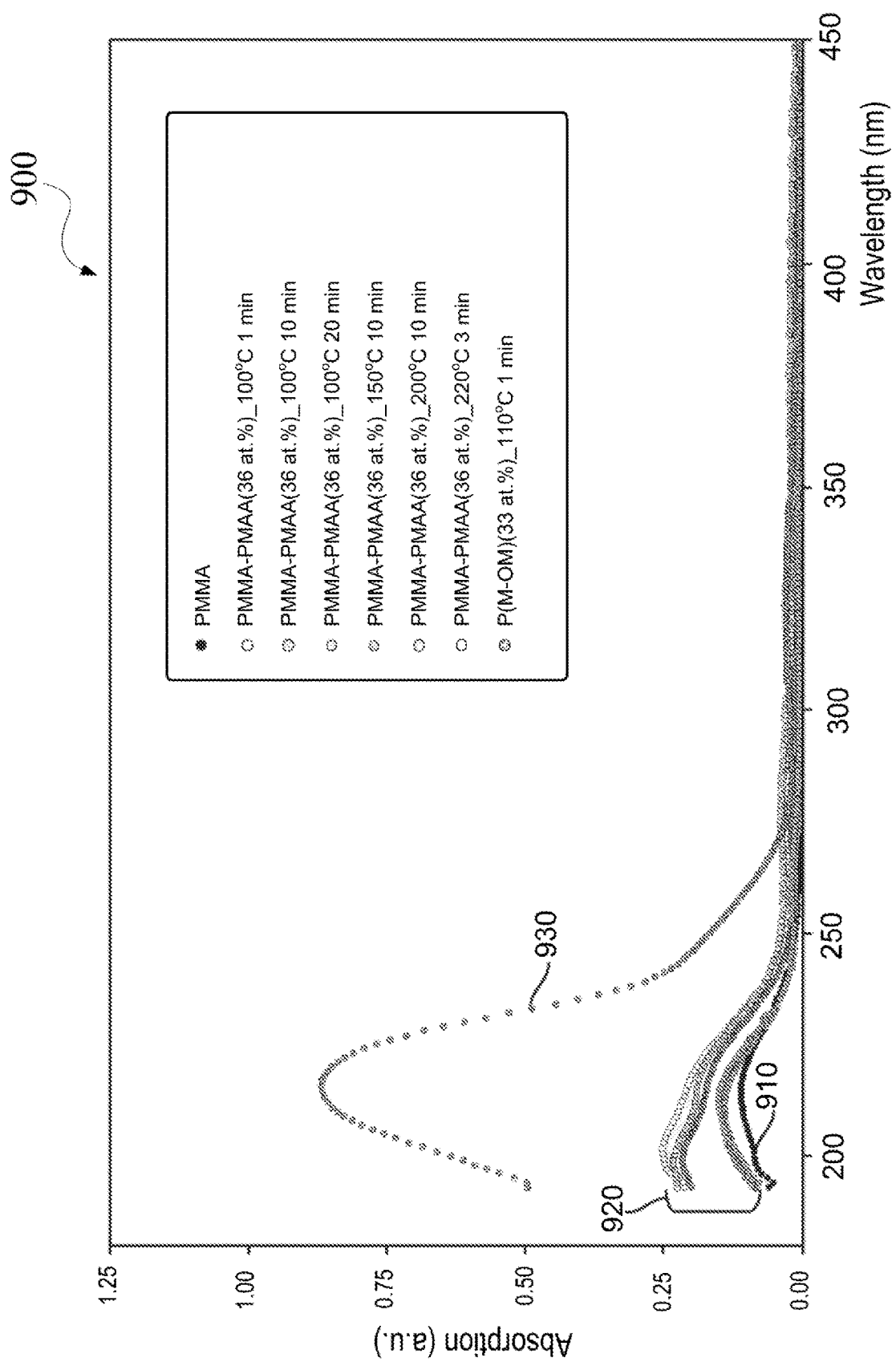
FIG. 9 illustrates UV light absorption rates of some examples of photoresist materials according to certain embodiments.

FIG. 9 is a chart 900 illustrating relative UV light absorption rates of some examples of gray-scale photoresist materials according to certain embodiments. Curve 910 shows the absorption rates of PMMA at different UV light wavelengths. Curve 910 shows that PMMA may have a relative low absorption rate even for UV light having a wavelength shorter than 250 nm or 200 nm. Curves 920 show the absorption rates of PMMA-PMAA (36 mole percent) baked under different conditions before exposed to UV light. The PMMA-PMAA (36 mole percent) may be baked at 100° C., 150° C., 200° C., or 220° for 1 minute, 3 minutes, 10 minutes, or 20 minutes. Curves 920 show that the PMMA-PMAA material may have a higher absorption rate than the PMMA material, but the UV absorption rate or photosensitivity may still be relatively low. Curve 930 shows the absorption rates of P(M-OM) (33 mole percent) at different UV light wavelengths. The P(M-OM) material associated with curve 930 may be baked at 110° C. for 1 minute before exposed to UV light. As shown by curve 930, the P(M-OM) material may have a much higher absorption rate (or sensitivity) below about 250 nm than the PMMA or PMMA-PMAA material.

Figure 10:
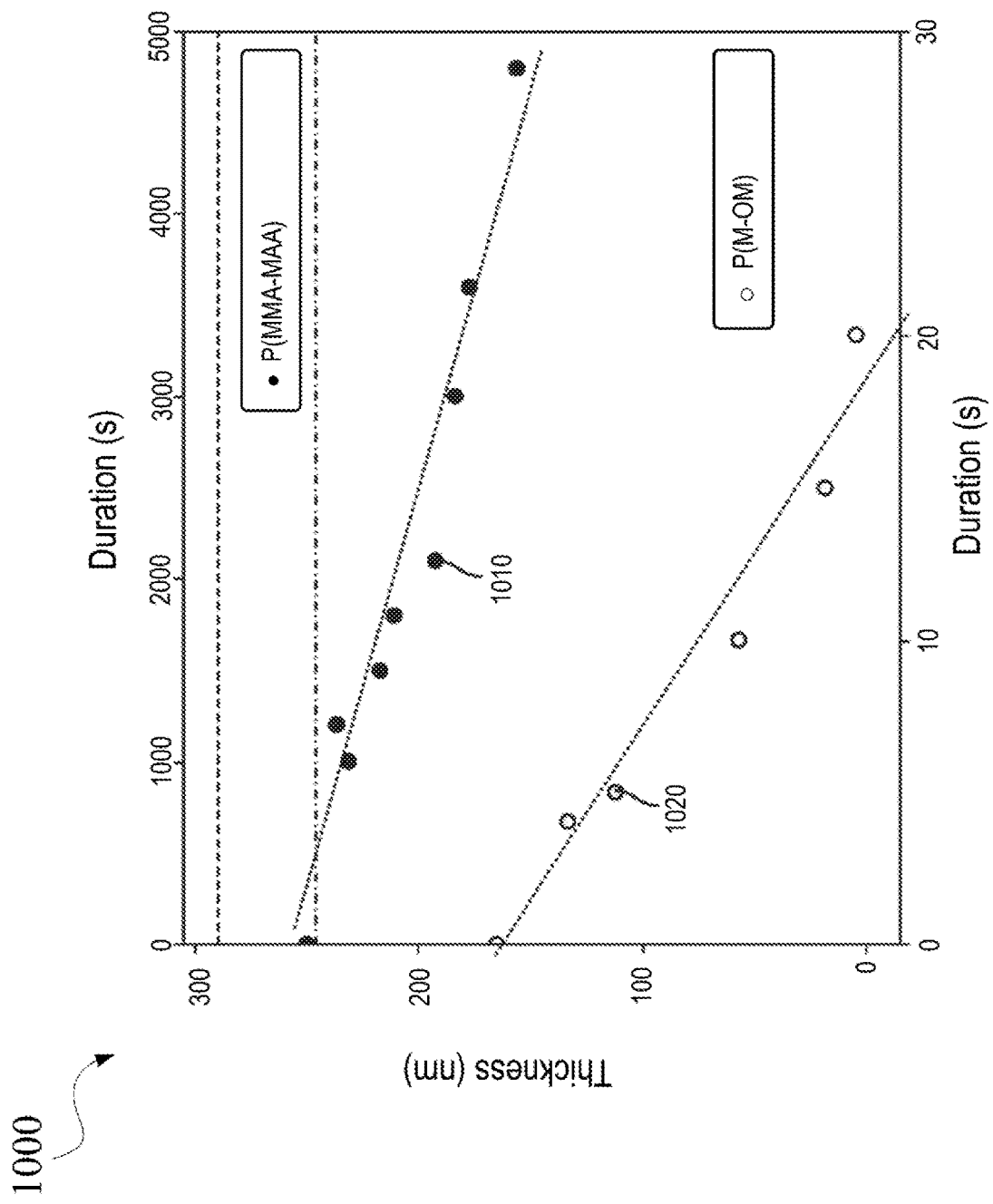
FIG. 10 illustrates the relationship between the photoresist thickness and the exposure time for two examples of gray-scale photoresist materials according to certain embodiments.

FIG. 10 illustrates the relationship between the photoresist thickness and the exposure time for two examples of gray-scale photoresist materials according to certain embodiments. One of the two gray-scale photoresist materials is PMMA-PMAA as described above. Data points 1010 show the thicknesses of a PMMA-PMAA layer after different exposure periods and photoresist development. The depth achieved (i.e., the thickness of the PMMA-PMAA layer removed) is approximately a linear function of the exposure time. Because of the relatively low sensitivity of PMMA-PMAA, a depth about 100 nm may be achieved after an exposure period of about 5,000 seconds. Similarly, data points 1020 show the thicknesses of a P(M-OM) layer after different exposure periods and photoresist development. The depth achieved (i.e., the thickness of the P(M-OM) layer removed) is approximately a linear function of the exposure time. Because the relatively high sensitivity of P(M-OM), a depth over 200 nm may be achieved after an exposure period of about 20 seconds. FIG. 10 shows that both PMMA-PMAA and P(M-OM) are sensitive to UV light and have a linear response to the exposure dose, and P(M-OM) has a much higher UV light sensitivity than PMMA-PMAA.

Figure 11:
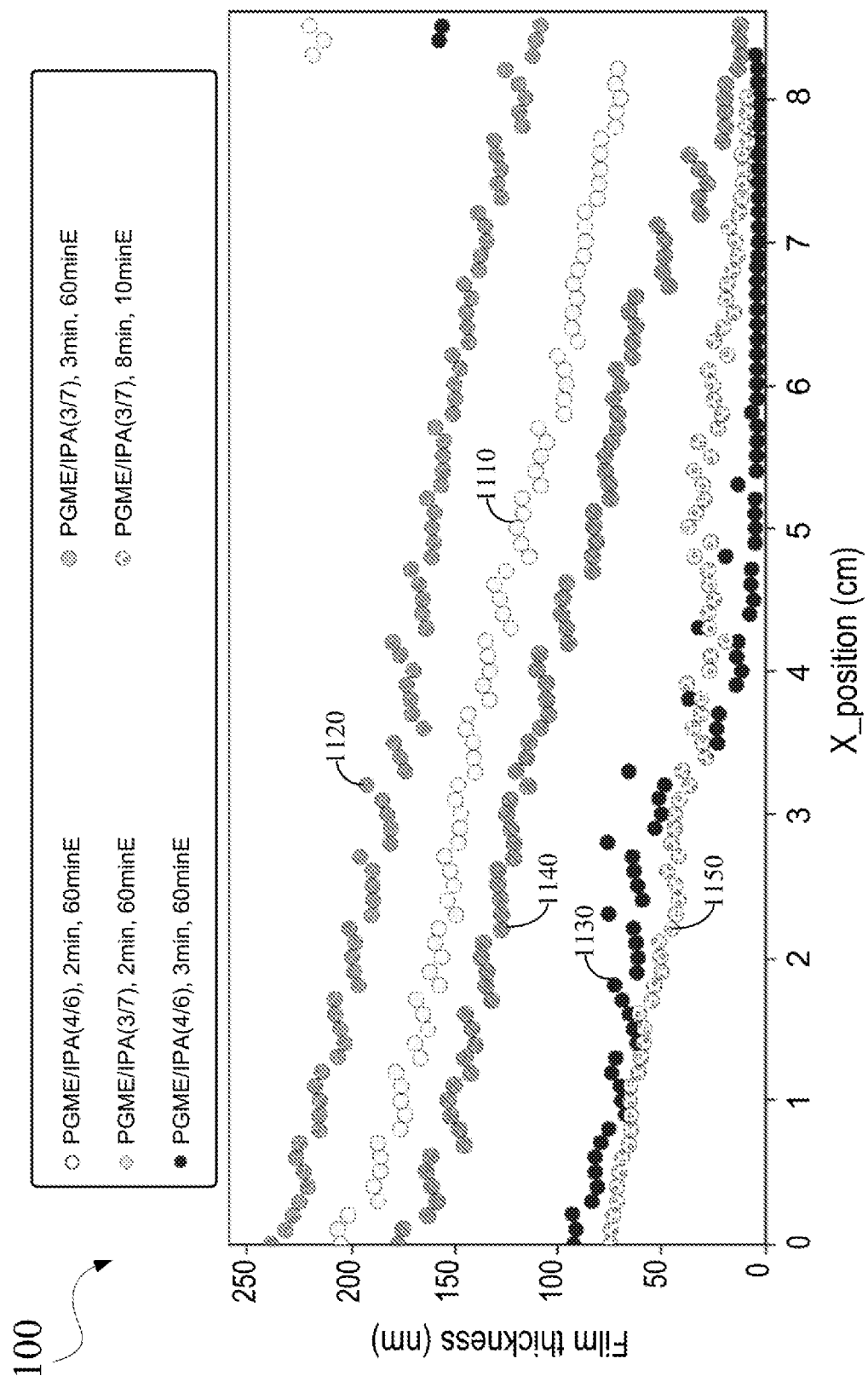
FIG. 11 illustrates the relationship between the photoresist thickness and the gray-scale level of a gray-scale photomask for different gray-scale photoresist materials and different processing conditions according to certain embodiments.

FIG. 11 is a graph 1100 illustrating the relationship between the remaining photoresist thickness and the gray-scale level of a gray-scale photomask for different gray-scale photoresist materials and different processing conditions according to certain embodiments. The photoresist materials used in the examples shown in FIG. 11 include PMMA-PMAA materials with different volume ratios between propylene glycol monomethyl ether (PGME) and isopropyl alcohol (IPA), such as 4:6, 3:7, or 2:8. The gray-scale photomask used in the example shown in FIG. 11 has 18 gray-scale levels. The exposure time may be about 10 minutes or 60 minutes, and the development time may be 2 minutes, 3 minutes, or 8 minutes. For example, data points 1110 show the remaining material thicknesses at different locations of a PMMA-PMAA photoresist material layer that has a PGME/IPA ratio about 4:6 and is exposed to UV light through a gray-scale photomask having different gray-scale levels at different locations for about 60 minutes and developed for about 2 minutes. Data points 1120 show the remaining material thicknesses at different locations of a PMMA-PMAA photoresist material layer that has a PGME/IPA ratio about 3:7 and is exposed to UV light through a gray-scale photomask having different gray-scale levels at different locations for about 60 minutes and developed for about 2 minutes. Data points 1130 show the remaining material thicknesses at different locations of a PMMA-PMAA photoresist material layer that has a PGME/IPA ratio about 4:6 and is exposed to UV light through a gray-scale photomask having different gray-scale levels at different locations for about 60 minutes and developed for about 3 minutes. Data points 1140 show the remaining material thicknesses at different locations of a PMMA-PMAA photoresist material layer that has a PGME/IPA ratio about 3:7 and is exposed to UV light through a gray-scale photomask having different gray-scale levels at different locations for about 60 minutes and developed for about 3 minutes. Data points 1150 show the remaining material thicknesses at different locations of a PMMA-PMAA photoresist material layer that has a PGME/IPA ratio about 2:8 and is exposed to UV light through a gray-scale photomask having different gray-scale levels at different locations for about 10 minutes and developed for about 8 minutes.

FIG. 11 shows that some PMMA-PMAA photoresist materials may be used to achieve an approximately linearly varying depth (with a total variation greater than about 100 nm or about 150 nm) under certain processing conditions. For example, exposing a PMMA-PMAA photoresist material with a PGME/IPA ratio about 3:7 to UV light for 60 minutes and developing the photoresist material for about 3 minutes may achieve a linearly varying depth with a variation greater than about 150 nm.

Figure 12:
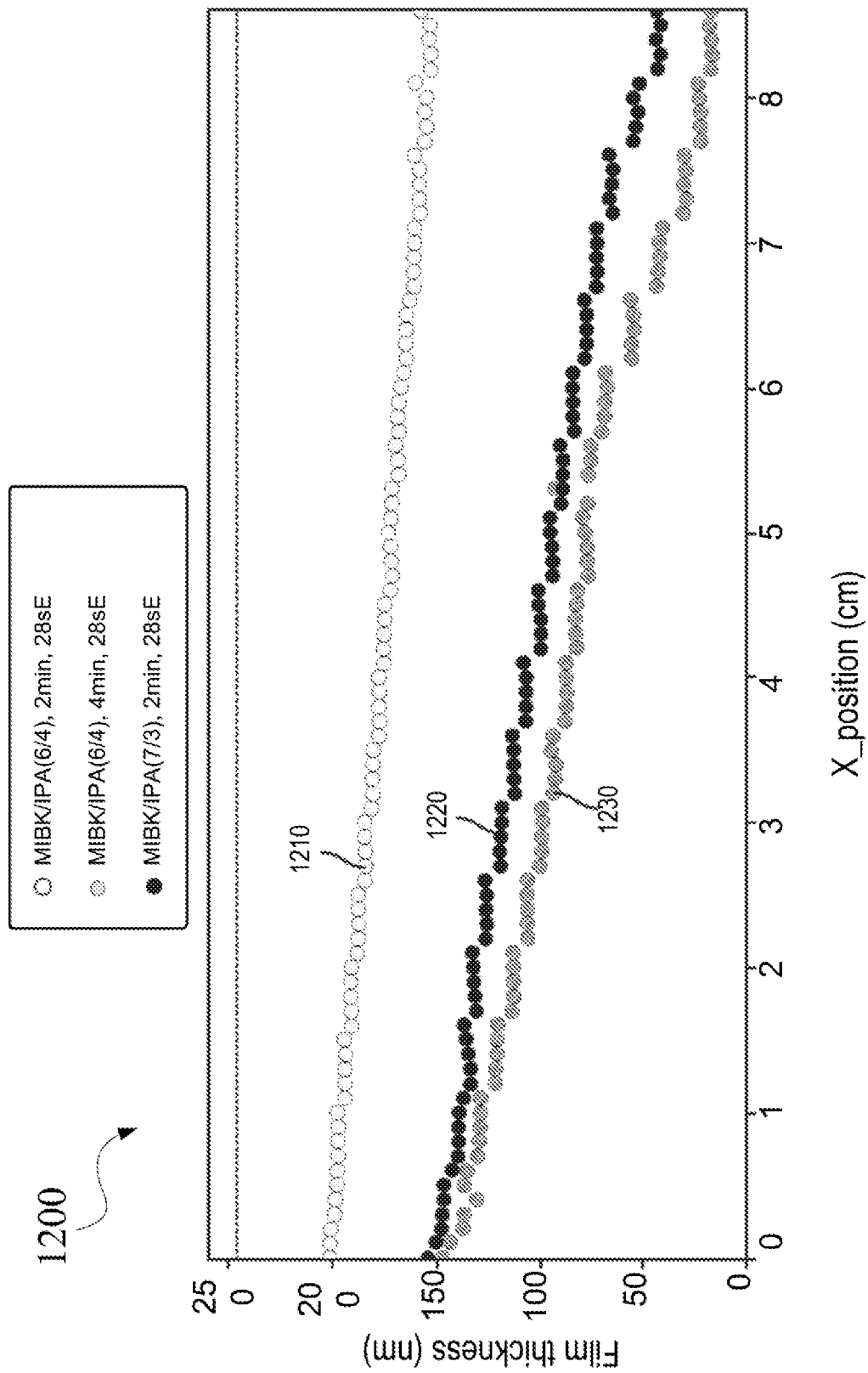
FIG. 12 illustrates the relationship between the photoresist thickness and the gray-scale level of a gray-scale photomask for different gray-scale photoresist materials and different processing conditions according to certain embodiments.

FIG. 12 is a graph 1200 illustrating the relationship between the remaining photoresist thickness and the gray-scale level of a gray-scale photomask for different gray-scale photoresist materials and different processing conditions according to certain embodiments. The photoresist materials used in the examples shown in FIG. 12 include P(M-OM) materials with different volume ratios between Methyl isobutyl ketone (MIBK) and isopropyl alcohol (IPA), such as about 6:4 or 7:3. The gray-scale photomask used in the example shown in FIG. 12 has 18 gray-scale levels. The exposure time is about 28 seconds, and the development time may be about 2 minutes, or about 8 minutes. FIG. 12 shows that the P(M-OM) materials can be used to achieve a linearly varying depth. For example, as shown by data points 1210, exposing a P(M-OM) material with an MIBK/IPA ratio about 6:4 to UV light for about 28 seconds and developing the photoresist for about 2 minutes may achieve a linearly varying depth with a total variation about 50 nm. As shown by data points 1220, exposing a P(M-OM) material with an MIBK/IPA ratio about 7:3 to UV light for about 28 seconds and developing the photoresist for about 2 minutes may achieve a linearly varying depth with a total variation about 100 nm. As shown by data points 1230, exposing a P(M-OM) material with an MIBK/IPA ratio about 6:4 to UV light for about 28 seconds and developing the photoresist for about 4 minutes may achieve a linearly varying depth with a variation about 150 nm.

In some embodiments, the etch chemistries used to etch the photoresist and the substrate may be optimized for different photoresists to tune the etch selectivity of the photoresists with respect to the substrate in order to transfer the thickness profile of the patterned photoresist layer to the substrate. For example, in some embodiments, the etch chemistries may include an oxygen source, such as $O_2$, $N_2O$, $CO_2$, CO, and the like. In some embodiments, the etch chemistries may include a nitrogen source, such as $N_2$, $N_2O$, $NH_3$, and the like.

In one example, the etch chemistries may be tuned such that the etch rate of PMMA-PMAA may be about the same as the etch rate of a $Si_3N_4$ substrate. In another example, chemicals, such as $N_2O$, may be added to the etch chemistries to improve the etch rate of the photoresist, such as P(M-OM), where the P(M-OM) material may have an etch rate higher than the etch rate of a $Si_3N_4$ substrate. In general, it is desirable that the gray-scale photoresist material has an etch rate approximately equal to or higher than the etch rate of the substrate. For example, the gray-scale photoresist material may have an etch rate that is between about 0.8 to 5 times or between about 0.9 to 1.5 times of the etch rate of the substrate. In some embodiments, if the gray-scale photoresist material has an etch rate higher than the etch rate of the substrate, the gray-scale photoresist material layer may need to be thicker in order to transfer the thickness profile of the gray-scale photoresist material layer to the substrate.

In some embodiments where ion beams are used for etching, the ion beam etch energy may be optimized for some photoresists to tune the etch selectivity of the photoresists with respect to the substrate in order to transfer the thickness profile of the patterned photoresist layer to the substrate. For example, the ion beam etch energy may be tuned between 100-500 eV. In some embodiments, both the etch chemistry and ion energy may be optimized to tune the etch selectivity of the photoresist with respect to the substrate in order to transfer the thickness profile of the patterned photoresist layer to the substrate.

Figure 13:
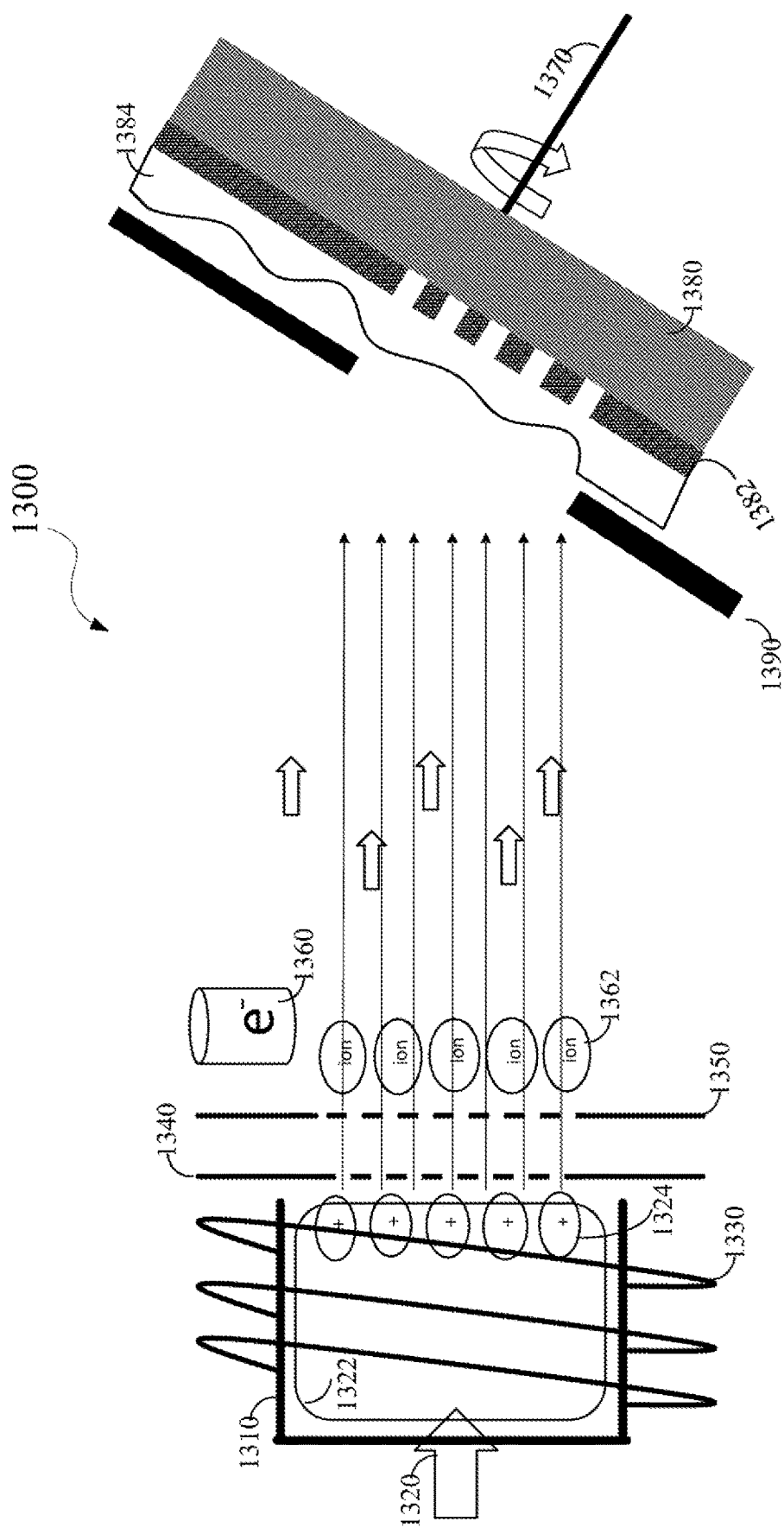
FIG. 13 illustrates an example of an ion beam etching system for fabricating a slanted variable-etch-depth surface-relief grating according to certain embodiments.

FIG. 13 illustrates an example of an ion beam etching system 1300 for fabricating a slanted variable-etch-depth surface-relief grating according to certain embodiments. Ion beam etching (IBE) generally uses a highly collimated and highly directional ion beam to physically mill materials from a substrate mounted on a rotation stage having an adjustable rotation angle. IBE system 1300 may include an ion source generator 1310. Ion source generator 1310 may include an inert gas inlet 1320 for receiving an inert gas, such as an Argon gas, into a chamber of ion source generator 1310. A plasma may be generated in ion source generator 1310 via an RF inductively coupled plasma (ICP) generator 1330, where highly energetic electrons may ionize neutrals of the injected inert gas (e.g., Ar) through collisions with the neutrals. A high density plasma 1322 may be generated within ion source generator 1310 by the impact ionization. High density plasma 1322 may be considered as a sea of neutrals with positive ions 1324 and negative electrons in charge equilibrium.

IBE system 1300 may also include one or more aligned collimator grids for extracting a collimated ion beam 1362 from high density plasma 1322 formed within ion source generator 1310. The aligned collimator grids may be implemented in various ways. For example, as shown in FIG. 13, the aligned collimator grids may include an extraction grid 1340 that may contact high density plasma 1322 and control its potential, and an acceleration grid 1350 that may be driven by an adjustable negative high voltage supply for accelerating the extracted ions. A beam neutralizer 1360 may be disposed near the aligned collimator grids and may emit an electron beam into collimated ion beam 1362 to achieve a net neutral charge flux associated with collimated ion beam 1362 in order to prevent the buildup of positive charges on the structure to be etched.

The highly directional collimated ion beam 1362 may physically mill materials from a gray-scale photoresist layer 1384 having a variable thickness and from a substrate 1380 to be etched, such as, for example, a semiconductor wafer, a glass substrate, a $Si_3N_4$ material layer, a titanium oxide layer, an alumina layer, etc. Substrate 1380 may be partially covered by a mask 1382, which may be formed on substrate 1380 by, for example, a photolithography process. Mask 1382 may include, for example, a photoresist material, a metal (e.g., copper, chrome, aluminum, or molybdenum), an intermetallic compound (e.g., $MoSi_2$), or a polymer. Gray-scale photoresist layer 1384 may be on top of mask 1382, and may have a variable thickness achieved by exposing to UV light through a gray-scale mask and developing the photoresist as described above. In some embodiments, a shutter 1390 (or blade) may be used to control the etch region, and the etch time and/or etch angles for different etch regions. Substrate 1380 may be mounted on a rotation stage 1370 that can be rotated to modify the angle of substrate 1380 with respect to the highly directional collimated ion beam 1362. The ability to modify the angle of substrate 1380 may allow for the creation of tailored sidewall profiles with minimal sputtered redeposition on mask 1382.

In some embodiments, IBE system 1300 may include a chemically assisted ion beam etching (CAME) system for fabricating a slanted variable-etch-depth surface-relief structure. In the chemically assisted ion beam etching, reactive species, such as a reactive gas (e.g., $CF_4$, $CHF_3$, $N_2$, $O_2$, $SF_6$, $Cl_2$, $BCl_3$, HBr, etc.) may be introduced into the process independent of the ion beam, for example, injected through a gas ring (not shown in FIG. 13) at a location close to substrate. Thus, the substrate and the photoresist layer to be etched may be etched both physically and chemically.

In some embodiments, IBE system 1300 may include a reactive ion beam etching (RIBE) system for fabricating a slanted variable-etch-depth surface-relief structure. The reactive ion beam etching system may inject a reactive gas (e.g., $CF_4$, $CHF_3$, $N_2$, $O_2$, $SF_6$, etc.) into the ion source generator to form a reactive ion beam that can both physically and chemically etch the material layer to be etched.

As described above, in some cases, light reflected at the interfaces between a gray-tone photoresist material described above and media adjacent to the photoresist material, such as the substrate or air, may at least partially interfere with each other to increase the total reflection, or may interfere with exposure light to cause standing waves in the gray-tone photoresist material, decrease exposure latitude, reduce the depth of focus, cause reflective notching, change the dimensions of the features formed in the gray-tone photoresist material, and/or increase the variability and non-uniformity of the straight or slanted grating having the desired 3-D profile, such as a variable-etch-depth grating.

For example, in some cases, light reflected at the top and bottom surfaces of the gray-tone photoresist material layer may at least partially constructively interfere with each other to increase the overall reflection. In some cases, light reflected at the bottom surface of the photoresist material layer may interfere with the exposure light propagating in the photoresist material layer to form standing waves (and thus light intensity distribution in the thickness direction) in the photoresist material layer. The light intensity distribution in the photoresist material layer may cause the width of the features formed in the photoresist material layer after the development process to vary in the thickness direction of the photoresist material layer, thereby forming ripples (referred to as reflective notching) in the sidewalls of the features in the photoresist material layer. The ripples cam change the lateral dimensions of the features, and may also cause diffusion of the etching beams during etching using the photoresist material layer as the etch mask.

According to certain embodiments, to increase the resolution of the gray tone photolithography, increase the depth of focus, and improve the uniformity of the manufactured gratings, one or more anti-reflective layers may be coated under and/or above the gray-tone photoresist material for the second mask layer. The anti-reflective layers coated at the surfaces of the photoresist material may help to reduce the light reflection at the interfaces between the photoresist material and adjacent media. For example, the anti-reflective layers may cause destructive interference between the reflected light or may absorb light passing through the anti-reflective layers to reduce the light reflection after passing through the anti-reflective layers.

Figures 14A, 14B:
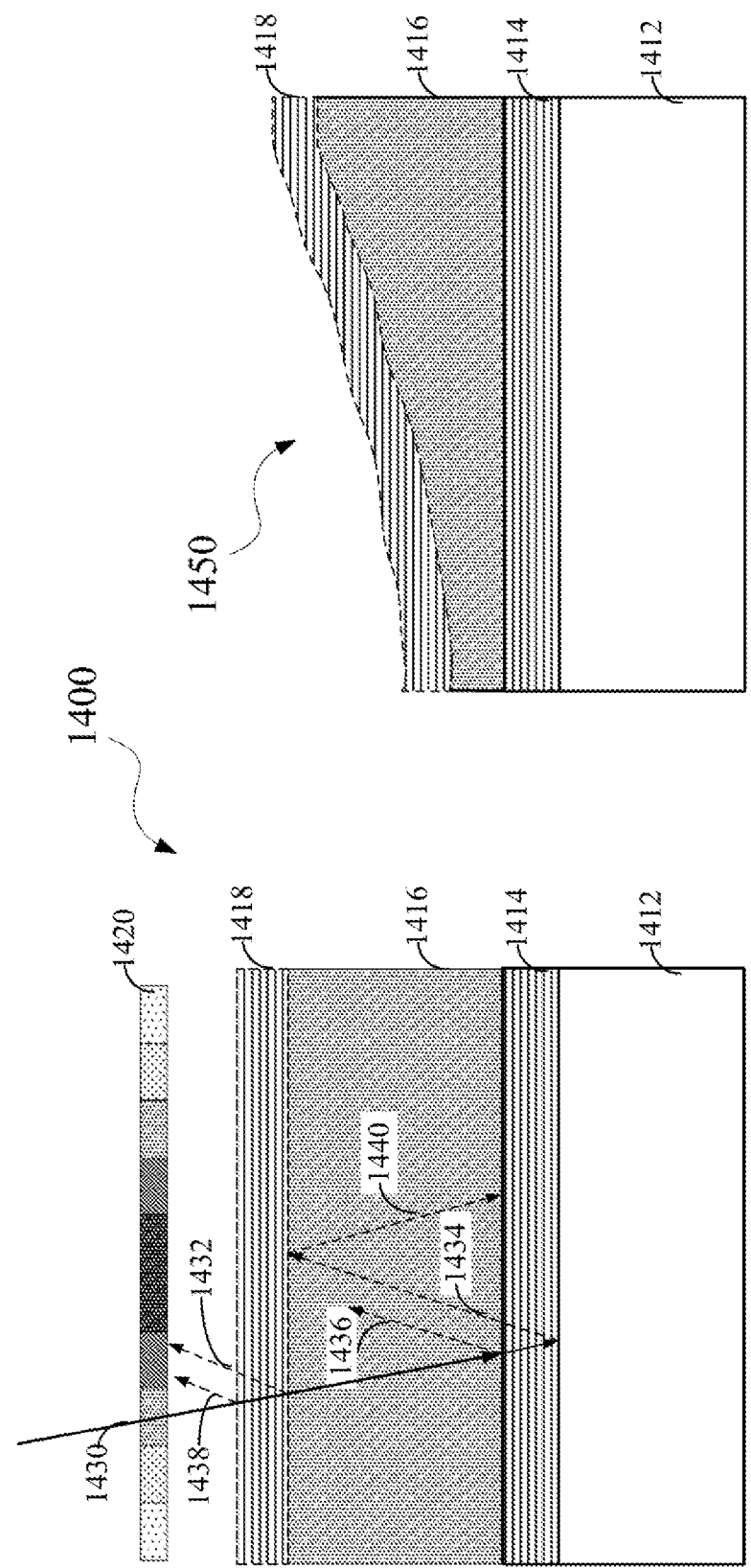
FIG. 14A illustrates an example of using anti-reflective coating(s) to increase the resolution of gray tone exposure according to certain embodiments.
FIG. 14B illustrates an example of a layer stack including a gray-tone photoresist material layer having a variable thickness according to certain embodiments.

FIG. 14A illustrates an example of using anti-reflective coating(s) to increase the resolution of gray tone exposure according to certain embodiments. In the illustrated example, an optional BARC layer 1414 may be deposited on a substrate 1412 (or a patterned etch mask formed on substrate 1412, such as metal grating mask 720) as described above with respective to, for example, FIG. 6. A gray-tone photoresist material layer 1416 (e.g., photoresist material layer 730) may be deposited on BARC layer 1414. Optionally, a TARC layer 1418 may be deposited on gray-tone photoresist material layer 1416 as described above with respective to, for example, FIG. 6. The layers may form a layer stack 1400. A gray-scale photomask 1420 (e.g., gray-scale photomask 740) may be used to expose gray-tone photoresist material layer 1416 to exposure light 1430 (e.g., UV light) as described above with respect to, for example, FIG. 7B.

As illustrated in FIG. 14A, when BARC layer 1414 and/or TARC layer 1418 are not used, a portion of exposure light 1430 (e.g., reflected exposure light 1432) may be reflected at the interface between gray-tone photoresist material layer 1416 and air, and a portion of exposure light 1430 (e.g., reflected exposure light 1434) may be reflected at the interface between gray-tone photoresist material layer 1416 and substrate 1412. Reflected exposure light 1432 and reflected exposure light 1434 may constructively interfere to increase the total reflection, which may, in some cases, reflected back to gray-tone photoresist material layer 1416 by gray-scale photomask 1420 to interfere with exposure light 1430. In some cases, reflected exposure light 1434 may be further reflected at the interface between gray-tone photoresist material layer 1416 and air (e.g., as shown by reflected exposure light 1440). Reflected exposure light 1434 may interfere with exposure light 1430 or reflected exposure light 1440 to form standing waves (not shown in FIG. 14A) in gray-tone photoresist material layer 1416, causing reflective notching as described above.

BARC layer 1414 may include, for example, one or more dielectric layers that may cause destructive interferences between light reflected at different surfaces of the one or more dielectric layers to reduce the effective reflection at the bottom surface of gray-tone photoresist material layer 1416. For example, exposure light 1434 reflected at the interface between BARC layer 1414 and substrate 1412 and exposure light 1436 reflected at the interface between BARC layer 1414 and gray-tone photoresist material layer 1416 may destructive interfere to reduce the overall reflection. In some embodiments, alternatively or additionally, BARC layer 1414 may include an absorptive material that may absorb and attenuate the exposure light that may propagate within BARC layer 1414, thereby reducing the amount of light reflected at the interface between BARC layer 1414 and substrate 1412 (e.g., reflected exposure light 1434). In some embodiments, BARC layer 1414 may have an etch rate comparable to (e.g., approximately similar to) the etch rate of gray-tone photoresist material layer 1416 or substrate 1412.

TARC layer 1418 may include, for example, one or more dielectric layers that may cause destructive interferences between light reflected at different surfaces of the one or more dielectric layers to reduce the effective reflection at the top surface of gray-tone photoresist material layer 1416. For example, exposure light 1438 reflected at the interface between TARC layer 1418 and the air and exposure light 1432 reflected at the interface between TARC layer 1418 and gray-tone photoresist material layer 1416 may destructive interfere to reduce the overall reflection. In some embodiments, TARC layer 1418 may be configured such that reflected exposure light 1438 (if any) and reflected exposure light 1434 (if any, e.g., when BARC layer 1414 is not used) may destructively interfere. In some embodiments, TARC layer 1418 may have an etch rate comparable to (e.g., approximately similar to) the etch rate of gray-tone photoresist material layer 1416 or substrate 1412.

FIG. 14B illustrates an example of a layer stack 1450 including a gray-tone photoresist material layer 1416 having a variable thickness according to certain embodiments. Layer stack 1450 may be formed after performing exposure and development processes on layer stack 1400. Layer stack 1450 includes substrate 1412, BARC layer 1414, and gray-tone photoresist material layer 1416 that has a variable thickness corresponding to the transmissivity of gray-scale photomask 1420. Optional TARC layer 1418 may or may not be on gray-tone photoresist material layer 1416 after the development process. TARC layer 1418, if remained on gray-tone photoresist material layer 1416, may have an etch rate comparable to (e.g., approximately similar to) the etch rate of gray-tone photoresist material layer 1416. Layer stack 1450 may be etched as described above to form a straight or slanted variable-etch-depth grating in substrate 1412.

Figure 15B:
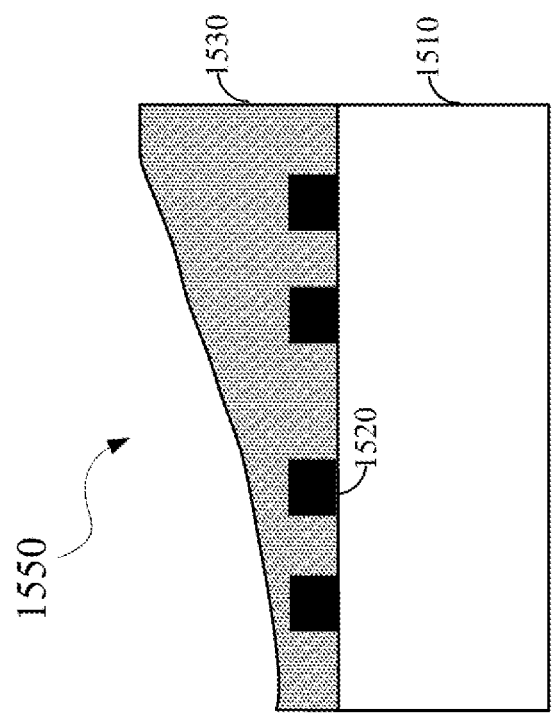
FIG. 15B illustrates an example of a layer stack including a gray-tone photoresist material layer having a variable thickness according to certain embodiments.
Figure 15A:
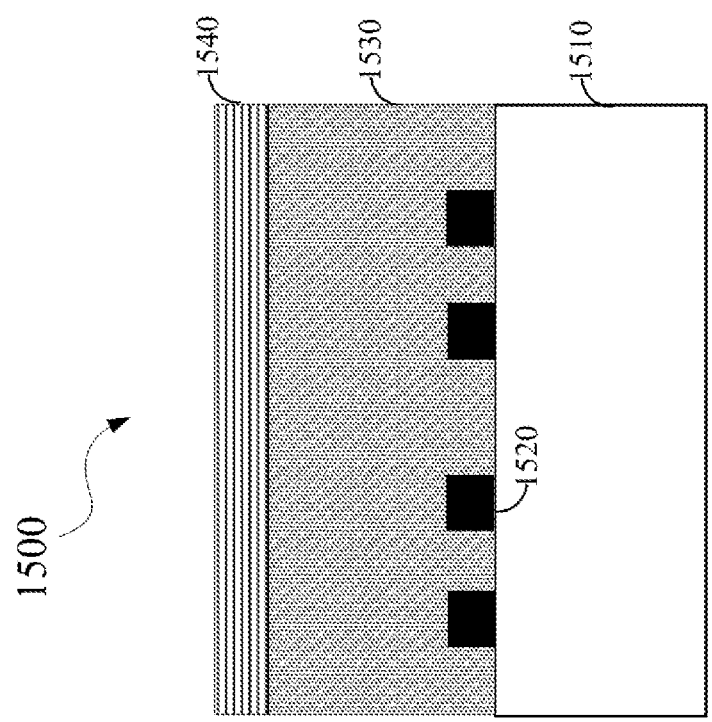
FIG. 15A illustrates an example of using an anti-reflective coating to increase the resolution of gray tone exposure according to certain embodiments.

FIG. 15A illustrates an example of using an anti-reflective coating to increase the resolution of gray tone exposure according to certain embodiments. A layer stack 1500 may include a patterned etch mask layer 1520 (e.g., a thin metal etch mask, such as a Cr hard mask) form on a substrate 1510 as described above with respective to, for example, FIGS. 6 and 7A. A gray-tone photoresist material layer 1530 (e.g., photoresist material layer 730) may be deposited on substrate 1510 and/or patterned etch mask layer 1520. A TARC layer 1540 may be deposited on gray-tone photoresist material layer 1530 as described above with respective to, for example, FIG. 6. A gray-scale photomask (e.g., gray-scale photomask 740 or 1420, not shown in FIG. 15A) may be used to expose gray-tone photoresist material layer 1530 to exposure light (e.g., UV light) as described above with respect to, for example, FIG. 7B. TARC layer 1540 may include, for example, one or more dielectric layers that may cause destructive interferences between light reflected at different surfaces of the one or more dielectric layers to reduce the effective reflection at the top surface of gray-tone photoresist material layer 1530. In some embodiments, TARC layer 1540 may be configured such that exposure light reflected at the top surface of TARC layer 1540 and exposure light reflected at the interface between gray-tone photoresist material layer 1530 and substrate 1510 may destructively interfere.

FIG. 15B illustrates an example of a layer stack 1550 including gray-tone photoresist material layer 1530 that has a variable thickness according to certain embodiments. Layer stack 1550 may be formed after the exposure and development processes performed on layer stack 1500. Layer stack 1550 includes substrate 1510, patterned etch mask layer 1520, and gray-tone photoresist material layer 1530 that has a variable thickness corresponding to the transmissivity of the gray-scale photomask. TARC layer 1540 may be removed after the development process. Layer stack 1550 may be etched as described above to form a straight or slanted variable-etch-depth grating in substrate 1510.

Figure 16B:
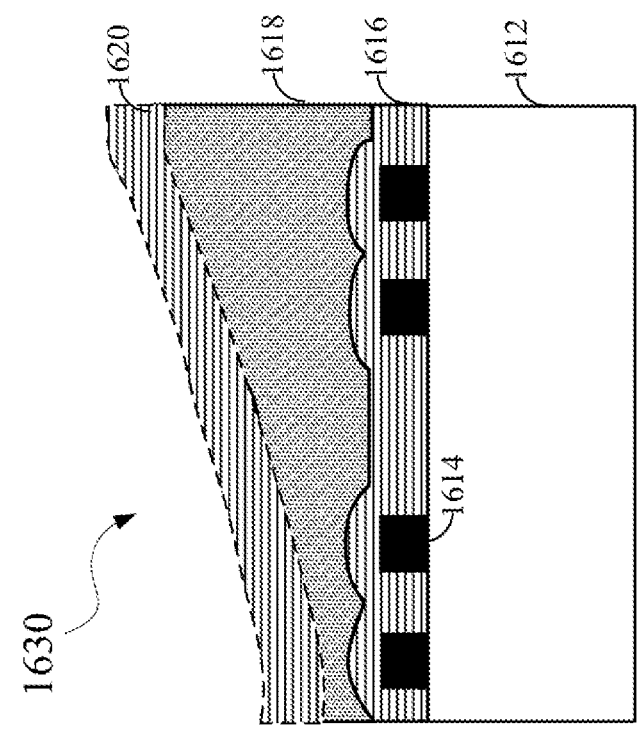
FIG. 16B illustrates an example of a layer stack including a gray-tone photoresist material layer having a variable thickness according to certain embodiments.
Figure 16A:
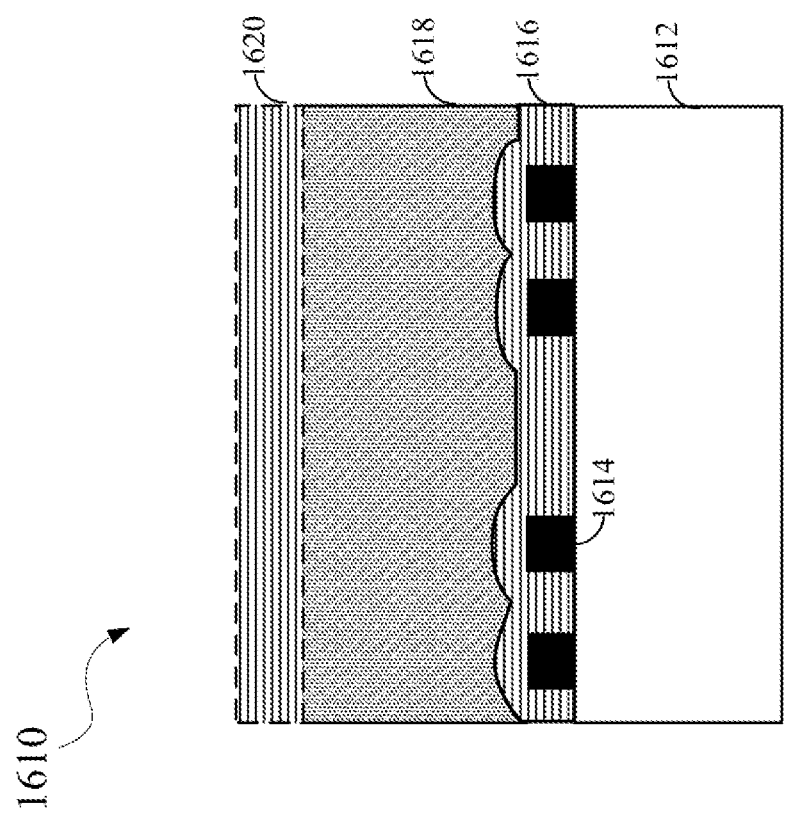
FIG. 16A illustrates an example of using anti-reflective coating(s) to increase the resolution of gray tone exposure according to certain embodiments.

FIG. 16A illustrates an example of using anti-reflective coating(s) to increase the resolution of gray tone exposure according to certain embodiments. In the illustrated example, a layer stack 1610 may include a patterned etch mask layer 1614 (e.g., a thin metal etch mask, such as a Cr hard mask) form on a substrate 1612 as described above with respective to, for example, FIGS. 6 and 7A. A BARC layer 1616 may be deposited on substrate 1612 and patterned etch mask layer 1614. A gray-tone photoresist material layer 1618 (e.g., photoresist material layer 730) may be deposited on BARC layer 1616. An optional TARC layer 1620 may be deposited on gray-tone photoresist material layer 1618 as described above with respective to, for example, FIG. 6. BARC layer 1616 and TARC layer 1620 may be similar to BARC layer 1414 and TARC layer 1418, respectively. A gray-scale photomask (e.g., gray-scale photomask 740 or 1420, not shown in FIG. 16A) may be used to expose gray-tone photoresist material layer 1618 to exposure light (e.g., UV light) as described above with respect to, for example, FIG. 7B.

FIG. 16B illustrates an example of a layer stack 1630 including gray-tone photoresist material layer 1618 that has a variable thickness according to certain embodiments. Layer stack 1630 may be formed after the exposure and development processes performed on layer stack 1610. In the example shown in FIG. 16B, layer stack 1630 may include substrate 1612, patterned etch mask layer 1614, BARC layer 1616, and gray-tone photoresist material layer 1618 that has a variable thickness corresponding to the transmissivity of the gray-scale photomask. Optional TARC layer 1620 may or may not be on gray-tone photoresist material layer 1416 after the development process. Layer stack 1630 may be etched as described above to form a straight or slanted variable-etch-depth grating in substrate 1612.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 17:
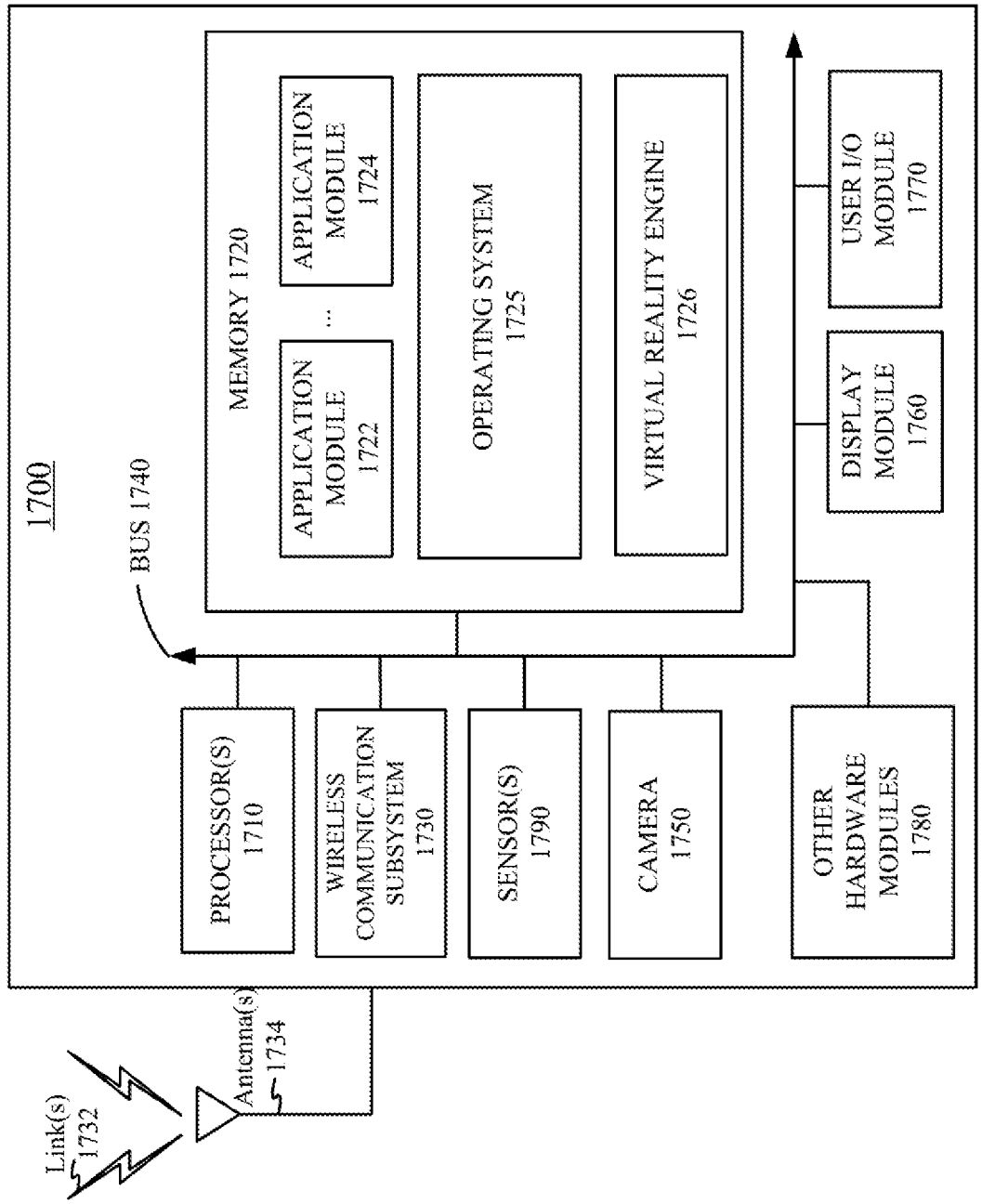
FIG. 17 is a simplified block diagram of an electronic system of an example of a near-eye display according to certain embodiments.

FIG. 17 is a simplified block diagram of an example electronic system 1700 of an example near-eye display (e.g., HMD device) for implementing some of the examples disclosed herein. Electronic system 1700 may be used as the electronic system of an HMD device or other near-eye displays described above. In this example, electronic system 1700 may include one or more processor(s) 1710 and a memory 1720. Processor(s) 1710 may be configured to execute instructions for performing operations at a number of components, and can be, for example, a general-purpose processor or microprocessor suitable for implementation within a portable electronic device. Processor(s) 1710 may be communicatively coupled with a plurality of components within electronic system 1700. To realize this communicative coupling, processor(s) 1710 may communicate with the other illustrated components across a bus 1740. Bus 1740 may be any subsystem adapted to transfer data within electronic system 1700. Bus 1740 may include a plurality of computer buses and additional circuitry to transfer data.

Memory 1720 may be coupled to processor(s) 1710. In some embodiments, memory 1720 may offer both short-term and long-term storage and may be divided into several units. Memory 1720 may be volatile, such as static random access memory (SRAM) and/or dynamic random access memory (DRAM) and/or non-volatile, such as read-only memory (ROM), flash memory, and the like. Furthermore, memory 1720 may include removable storage devices, such as secure digital (SD) cards. Memory 1720 may provide storage of computer-readable instructions, data structures, program modules, and other data for electronic system 1700. In some embodiments, memory 1720 may be distributed into different hardware modules. A set of instructions and/or code might be stored on memory 1720. The instructions might take the form of executable code that may be executable by electronic system 1700, and/or might take the form of source and/or installable code, which, upon compilation and/or installation on electronic system 1700 (e.g., using any of a variety of generally available compilers, installation programs, compression/decompression utilities, etc.), may take the form of executable code.

In some embodiments, memory 1720 may store a plurality of application modules 1722 through 1724, which may include any number of applications. Examples of applications may include gaming applications, conferencing applications, video playback applications, or other suitable applications. The applications may include a depth sensing function or eye tracking function. Application modules 1722-1724 may include particular instructions to be executed by processor(s) 1710. In some embodiments, certain applications or parts of application modules 1722-1724 may be executable by other hardware modules 1780. In certain embodiments, memory 1720 may additionally include secure memory, which may include additional security controls to prevent copying or other unauthorized access to secure information.

In some embodiments, memory 1720 may include an operating system 1725 loaded therein. Operating system 1725 may be operable to initiate the execution of the instructions provided by application modules 1722-1724 and/or manage other hardware modules 1780 as well as interfaces with a wireless communication subsystem 1730 which may include one or more wireless transceivers. Operating system 1725 may be adapted to perform other operations across the components of electronic system 1700 including threading, resource management, data storage control and other similar functionality.

Wireless communication subsystem 1730 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1700 may include one or more antennas 1734 for wireless communication as part of wireless communication subsystem 1730 or as a separate component coupled to any portion of the system. Depending on desired functionality, wireless communication subsystem 1730 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1730 may permit data to be exchanged with a network, other computer systems, and/or any other devices described herein. Wireless communication subsystem 1730 may include a means for transmitting or receiving data, such as identifiers of HMD devices, position data, a geographic map, a heat map, photos, or videos, using antenna(s) 1734 and wireless link(s) 1732. Wireless communication subsystem 1730, processor(s) 1710, and memory 1720 may together comprise at least a part of one or more of a means for performing some functions disclosed herein.

Embodiments of electronic system 1700 may also include one or more sensors 1790. Sensor(s) 1790 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1790 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1700 may include a display module 1760. Display module 1760 may be a near-eye display, and may graphically present information, such as images, videos, and various instructions, from electronic system 1700 to a user. Such information may be derived from one or more application modules 1722-1724, virtual reality engine 1726, one or more other hardware modules 1780, a combination thereof, or any other suitable means for resolving graphical content for the user (e.g., by operating system 1725). Display module 1760 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1700 may include a user input/output module 1770. User input/output module 1770 may allow a user to send action requests to electronic system 1700. An action request may be a request to perform a particular action. For example, an action request may be to start or end an application or to perform a particular action within the application. User input/output module 1770 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1700. In some embodiments, user input/output module 1770 may provide haptic feedback to the user in accordance with instructions received from electronic system 1700. For example, the haptic feedback may be provided when an action request is received or has been performed.

Electronic system 1700 may include a camera 1750 that may be used to take photos or videos of a user, for example, for tracking the user's eye position. Camera 1750 may also be used to take photos or videos of the environment, for example, for VR, AR, or MR applications. Camera 1750 may include, for example, a complementary metal-oxide-semiconductor (CMOS) image sensor with a few millions or tens of millions of pixels. In some implementations, camera 1750 may include two or more cameras that may be used to capture 3-D images.

In some embodiments, electronic system 1700 may include a plurality of other hardware modules 1780. Each of other hardware modules 1780 may be a physical module within electronic system 1700. While each of other hardware modules 1780 may be permanently configured as a structure, some of other hardware modules 1780 may be temporarily configured to perform specific functions or temporarily activated. Examples of other hardware modules 1780 may include, for example, an audio output and/or input module (e.g., a microphone or speaker), a near field communication (NFC) module, a rechargeable battery, a battery management system, a wired/wireless battery charging system, etc.

In some embodiments, one or more functions of other hardware modules 1780 may be implemented in software.

In some embodiments, memory 1720 of electronic system 1700 may also store a virtual reality engine 1726. Virtual reality engine 1726 may execute applications within electronic system 1700 and receive position information, acceleration information, velocity information, predicted future positions, or some combination thereof of the HMD device from the various sensors. In some embodiments, the information received by virtual reality engine 1726 may be used for producing a signal (e.g., display instructions) to display module 1760. For example, if the received information indicates that the user has looked to the left, virtual reality engine 1726 may generate content for the HMD device that mirrors the user's movement in a virtual environment. Additionally, virtual reality engine 1726 may perform an action within an application in response to an action request received from user input/output module 1770 and provide feedback to the user. The provided feedback may be visual, audible, or haptic feedback. In some implementations, processor(s) 1710 may include one or more GPUs that may execute virtual reality engine 1726.

In various implementations, the above-described hardware and modules may be implemented on a single device or on multiple devices that can communicate with one another using wired or wireless connections. For example, in some implementations, some components or modules, such as GPUs, virtual reality engine 1726, and applications (e.g., tracking application), may be implemented on a console separate from the head-mounted display device. In some implementations, one console may be connected to or support more than one HMD.

In alternative configurations, different and/or additional components may be included in electronic system 1700. Similarly, functionality of one or more of the components can be distributed among the components in a manner different from the manner described above. For example, in some embodiments, electronic system 1700 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense.

In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
    forming a patterned etch mask on a substrate;
    depositing a photoresist material layer on the patterned etch mask, the photoresist material layer sensitive to ultra-violet (UV) light and having a linear response to UV light dose;
    exposing the photoresist material layer to UV light through a variable transparency photomask;
    developing the photoresist material layer exposed to the UV light to form a patterned photoresist layer having a non-uniform thickness;
    etching the patterned photoresist layer and the substrate to obtain a grating having a non-uniform etch depth in the substrate, wherein the patterned photoresist layer is characterized by an etch rate comparable to an etch rate of the substrate; and
    removing the patterned photoresist layer and the patterned etch mask from the substrate.

2. The method of claim 1, further comprising at least one of:
    depositing, before depositing the photoresist material layer, a first anti-reflective coating layer on the patterned etch mask, or
    depositing, after depositing the photoresist material layer, a second anti-reflective coating layer on the photoresist material layer.

3. The method of claim 1, wherein etching the patterned photoresist layer and the substrate comprises:
    etching the patterned photoresist layer and the substrate at a slant angle greater than 10° with respect to a surface normal of the substrate.

4. The method of claim 3, wherein the slant angle is between 30° and 70°.

5. The method of claim 1, wherein the photoresist material layer is sensitive to light having a wavelength shorter than 300 nm, 250 nm, 193 nm, or 157 nm.

6. The method of claim 1, wherein the etch rate of the patterned photoresist layer is between 0.5 and 5 times of the etch rate of the substrate in a same etching process.

7. The method of claim 1, wherein a depth of an exposed portion of the photoresist material layer is a linear function of the UV light dose.

8. The method of claim 1, wherein the photoresist material layer includes a positive-tone photoresist.

9. The method of claim 1, wherein the photoresist material layer includes Poly(methyl methacrylate) (PMMA) sensitized with a photosensitive group.

10. The method of claim 9, wherein the photosensitive group includes at least one of:
    an acyloximino group;
    methacrylonitrile;
    terpolymer of methyl methacrylate;
    oximino methacrylate;
    benzoic acids;
    N-acetylcarbazole; or
    indenone.

11. The method of claim 1, wherein the photoresist material layer includes at least one of:
    poly(methyl methacrylate)-r-poly(tert-butyl methacrylate)-r-poly(methyl methacrylate) and a photo acid generator;
    poly(methyl methacrylate)-r-poly(methacrylic acid);
    poly(α-methylstyrene-co-methyl chloroacrylate) and an acid generator;
    polycarbonate and a photo acid or base generator;
    polylactide and a photo acid or base generator; or
    polyphthalaldehyde and a photo acid generator.

12. The method of claim 1, wherein the non-uniform etch depth in the substrate includes at least 8 different depth levels.

13. The method of claim 1, wherein a maximum depth of the non-uniform etch depth in the substrate is greater than 100 nm.

14. The method of claim 1, wherein etching the patterned photoresist layer and the substrate includes etching the patterned photoresist layer and the substrate using at least one of:
    an oxygen source including $O_2$, $N_2O$, $CO_2$, or $CO$;
    a nitrogen source including $N_2$, $N_2O$, or $NH_3$; or
    ions with an energy between 100-500 eV.

15. The method of claim 1, wherein the variable transparency photomask includes a gray-scale photomask.

16. The method of claim 15, wherein the gray-scale photomask includes at least 8 different transmissivity levels.

17. A slanted surface-relief structure for waveguide display, the slanted surface-relief structure comprising:
a substrate; and
a slanted surface-relief optical grating in the substrate, the slanted surface-relief optical grating having a flat top surface and including a plurality of grating ridges and a plurality of grating grooves, each of the plurality of grating grooves characterized by a corresponding depth,
wherein depths of the plurality of grating grooves include at least 8 different depth levels and vary in two directions across the slanted surface-relief optical grating according to a predetermined profile; and
wherein a slant angle of at least one grating ridge in the plurality of grating ridges is greater than 30° with respect to a surface normal of the substrate.

18. The slanted surface-relief structure of claim 17, wherein the depths of the plurality of grating grooves range from 0 nm to greater than 100 nm.

19. The slanted surface-relief structure of claim 17, wherein the corresponding depth of a grating groove in the plurality of grating grooves varies across the slanted surface-relief optical grating.

20. The slanted surface-relief structure of claim 17, wherein the slanted surface-relief optical grating has different grating duty cycles at different regions of the slanted surface-relief optical grating.

21. The slanted surface-relief structure of claim 20, wherein the slanted surface-relief optical grating is characterized by a duty cycle greater than 70%.

22. The slanted surface-relief structure of claim 20, wherein the slanted surface-relief optical grating is characterized by a duty cycle less than 30%.

23. The slanted surface-relief structure of claim 17, wherein the slanted surface-relief optical grating has different grating periods at different regions of the slanted surface-relief optical grating.

24. A photoresist material for fabricating a variable-etch-depth grating, wherein:
the photoresist material is sensitive to light with a wavelength shorter than 300 nm;
the photoresist material is characterized by an etch rate that is between 0.5 and 5 times of an etch rate of a substrate; and
the photoresist material is characterized by a linear response to UV light dose such that a depth of an exposed portion of the photoresist material is a linear function of the UV light dose.

25. The photoresist material of claim 24, wherein the photoresist material includes at least one of:
Poly(methyl methacrylate) (PMMA) sensitized with a photosensitive group;
poly(methyl methacrylate)-r-poly(tert-butyl methacrylate)-r-poly(methyl methacrylate) and a photo acid generator;
poly(methyl methacrylate)-r-poly(methacrylic acid);
poly(α-methylstyrene-co-methyl chloroacrylate) and an acid generator;
polycarbonate and a photo acid or base generator;
polylactide and a photo acid or base generator; or
polyphthalaldehyde and a photo acid generator.

\* \* \* \* \*